United States Patent
Kuo et al.

(10) Patent No.: US 11,127,564 B2
(45) Date of Patent: Sep. 21, 2021

(54) SCANNING ELECTRON MICROSCOPE WITH OBJECTIVE LENS BELOW SAMPLE STAGE

(71) Applicant: KKT Holdings Syndicate, Dover, DE (US)

(72) Inventors: Tzu-Yi Kuo, Taipei (TW); Yu-Kuang Tseng, Taipei (TW)

(73) Assignee: KKT HOLDINGS SYNDICATE, Dover, DE (US)

(*) Notice: Subject to any disclaimer, the term of this patent is extended or adjusted under 35 U.S.C. 154(b) by 0 days.

(21) Appl. No.: 16/743,250

(22) Filed: Jan. 15, 2020

(65) Prior Publication Data
US 2020/0227231 A1    Jul. 16, 2020

Related U.S. Application Data

(60) Provisional application No. 62/792,530, filed on Jan. 15, 2019.

(51) Int. Cl.
| | | |
|---|---|---|
| *H01J 37/28* | (2006.01) | |
| *H01J 37/244* | (2006.01) | |
| *H01J 37/145* | (2006.01) | |
| *H01J 37/147* | (2006.01) | |
| *H01L 21/687* | (2006.01) | |
| *H01J 37/20* | (2006.01) | |

(52) U.S. Cl.
CPC ............ *H01J 37/28* (2013.01); *H01J 37/145* (2013.01); *H01J 37/1475* (2013.01); *H01J 37/20* (2013.01); *H01J 37/244* (2013.01); *H01L 21/68785* (2013.01); *H01J 2237/24475* (2013.01)

(58) Field of Classification Search
CPC ........ H01J 37/28; H01J 37/244; H01J 37/145; H01J 37/1475; H01J 37/20; H01J 2237/24475; H01J 2237/04926; H01J 2237/20257; H01J 2237/2511; H01J 2237/1035; H01J 2237/047; H01J 2237/1415; H01L 21/68785
See application file for complete search history.

(56) References Cited

U.S. PATENT DOCUMENTS

| | | | | |
|---|---|---|---|---|
| 4,458,151 | A * | 7/1984 | Koike ................ | H01J 37/04 250/310 |
| 5,563,415 | A * | 10/1996 | Crewe ................ | H01J 37/141 250/396 ML |
| 2013/0293865 | A1* | 11/2013 | Ummethala ........ | H01J 37/3174 355/75 |
| 2016/0217967 | A1* | 7/2016 | Dohi ................ | H01J 37/1472 |
| 2016/0217968 | A1* | 7/2016 | Li ................ | H01J 37/1477 |
| 2017/0271124 | A1* | 9/2017 | Sasaki ................ | H01J 37/244 |
| 2018/0033588 | A1* | 2/2018 | Kumamoto ............ | H01J 37/21 |
| 2019/0088445 | A1* | 3/2019 | Jiruse ................ | H01J 37/05 |
| 2020/0185191 | A1* | 6/2020 | Gamm ................ | H01J 37/304 |

* cited by examiner

*Primary Examiner* — Brooke Purinton
(74) *Attorney, Agent, or Firm* — WPAT, PC

(57) ABSTRACT

An immersion objective lens is configured below a stage such that multiple detectors can be configured above sample for large beam current application, particularly for defect inspection. Central pole piece of the immersion objective lens thus can be provided that a magnetic monopole-like field can be provided for electron beam. Auger electron detector thus can be configured to analyze materials of sample in the defect inspection.

20 Claims, 26 Drawing Sheets

SCANNING ELECTRON MICROSCOPE WITH OBJECTIVE LENS BELOW SAMPLE STAGE

CLAIM OF PRIORITY

This application claims the benefit of priority of U.S. provisional application No. 62/792,530 entitled to inventors filed Jan. 15, 2019 and entitled "Scanning Electron Microscope", the entire disclosures of which are incorporated herein by reference.

FIELD OF THE INVENTION

The invention relates to a SEM, and more particular to a method and system for inspecting defects by using SEM. However, it would be recognized that the invention has a much broader range of applicability.

BACKGROUND OF THE INVENTION

In the semiconductor manufacturing process, defect inspection is very critical. Conventional defect inspection employs the optical system to identify defects. However, while the semiconductor process advances with the Moore's law, the optical system can't identify defects anymore, and hence scanning electron microscope (SEM) is used to identify the defects. However, although the SEM can identify defects with ultrahigh resolution, the throughput is too slow compared to the optical system. In practice, the bright field optical system can identify defects within 30 minutes for a twelve inch wafer, while the dark field optical system can identify defects within five minutes. For the SEM, it may need about ten months to scan a full wafer of twelve inch. It is not only unacceptable in the semiconductor manufacture, but also in the RD stage.

In order to increase the throughput of the defect inspection by using SEM, except sampling, a popular method is to increase beam current. There are several advantages. First, signal electrons must be so numerous to be received. Another advantage is to lower scan average times to increase throughput. More important, the voltage contrast (VC) defect can be identified only in the large beam current condition.

However, in order to increase beam current, some specific design for the electron optics is necessary. First, the large beam current will increase Coulomb compel forces which incurs aberration. Therefore, a method to solve this issue is to adapt high landing energy of the electron beam, such that electrons can reach the sample fast enough. The more landing energy, the less aberration incurred by the Coulomb compel force will be. Another method to solve this issue is to adapt immersion objective lens for the large beam current; that is a gap between the inner polepiece and outer polepiece will face to the sample instead of the electron beam. Further, the objective lens will be as much as close to the sample which lowers the working distance to avoid focusing power of the magnetic lens is not enough.

Moreover, in order to avoid damaging wafer by using high landing energy electron beam, the electron beam inspection tool adapts low-voltage SEM, wherein the landing energy of the electron beam will be less than 1500 eV. In order to apply large beam current to the SEM and to avoid Coulomb compel force, the energy of the electron beam can't be adjusted directly. A retard electrode is applied to the sample such that not only energy of the electron beam can be lowered to an acceptable range, but also potential difference between objective lens and sample can be lowered which always incurs arcing from the objective lens to sample. Furthermore, the potential distribution among the retard electrode, objective lens, and sample will constitute an electrostatic lens and therefore a compound electromagnetic lens is formed.

The immersion lens and retard electrode will reduce the working distance of the SEM to about 1.5 mm, and there is no more space to adapt any detector. Hence, the detector is always configured above the objective lens. This way will make the detector to receive secondary electrons mostly, and image of the secondary electrons will provide information of topography of the sample. By using this way, the SEM with large beam current can image the topography of the sample. However, there is no material information of the sample.

Another method to apply the SEM to yield management of the semiconductor manufacture process is the review SEM developed by Applied Materials. The review SEM does not use large beam current, so different kinds of detector can be configured at surface of the sample to receive different signal electrons, such as backscattered electrons and X-ray. However, the review SEM has ultralow throughput compared to the ebeam inspection tool, and can't be applied in the defect inspection. Hence, after defects are inspected by the ebeam inspection tool, the sample wafer is transferred to the review SEM to analyze the defects and to classify defects due to only abnormalities can be identified in the ebeam inspection tool.

For the semiconductor manufacturer, it would be a better to have a tool to include functions of defect inspection of the ebeam inspection tool and defect review of the review SEM to increase throughput. Therefore, there is a necessary to provide a SEM with both defect inspection and defect review functions.

BRIEF SUMMARY OF THE INVENTION

The object of this invention is to provide a SEM including defect inspection and defect review.

Accordingly, the invention provides a charged particle beam apparatus, which comprises a charged particle source for providing a charged particle beam, a condenser lens for condensing the charged particle beam, a scanning unit for scanning the charged particle beam on a sample, a stage for supporting the sample, a detector system for receiving signal particles from the sample after the charged particle beam impinges on the sample, and an objective lens, below said stage, including a central polepiece aligned to the charged particle beam for focusing the charged particle beam on the sample. The stage includes two mesas movable in a first direction and a second direction respectively, and the second direction is orthogonal to the first direction. The stage further includes an electrostatic chuck for supporting the sample. Each mesa has an opening respectively. The central polepiece protrudes through the two openings such that the central polepiece is located blow and adjacent to the electrostatic chuck.

In the charged particle beam apparatus according to the present invention, the charged particle source provides an electron beam.

In the charged particle beam apparatus according to the present invention, the stage is a maglev stage.

In the charged particle beam apparatus according to the present invention, the maglev stage includes a first mesa movable along a first direction horizontally, a second mesa movable along a second direction horizontally perpendicular to the first direction, and an electrostatic chuck on the second mesa.

In the charged particle beam apparatus according to the present invention, the first mesa and second mesa are vertically movable.

In the charged particle beam apparatus according to the present invention, the signal particles includes secondary electrons, backscattered electrons, and Auger electrons.central polepiece protrudes to the sample.

In the charged particle beam apparatus according to the present invention, the detector system includes a SE detector, a BSE detector, and an AE detector for receiving secondary electrons, backscattered electrons, and Auger electrons respectively.

In the present invention, the charged particle beam apparatus further comprises a booster inside the condenser lens to accelerate the electron beam.

In the present invention, the charged particle beam apparatus further comprises a retard electrode above the sample to retard the electron beam.

In the present invention, the charged particle beam apparatus further comprises a ferrite layer below said retard electrode to couple with a magnetic field generated by the objective lens.

In the present invention, the charged particle beam apparatus further comprises a first Wien filter for filtering the secondary electrons into said SE detector, and a second Wien filter for filtering the backscattered electrons into said BSE detector.

In the present invention, the charged particle beam apparatus further comprises a variable deflector around the central pole piece of the objective such that said objective lens is a variable axis lens.

In the charged particle beam apparatus according to the present invention, the variable axis lens is a moving objective lens.

In the present invention, the charged particle beam apparatus further comprises a first deflector and a second deflector to move the electron beam along an axis of the moving objective lens.

In the charged particle beam apparatus according to the present invention, the variable axis lens is a swing objective lens.

In the present invention, the charged particle beam apparatus further comprises a deflector to moving the electron beam along an axis of the swing objective lens.

The invention therefore provides an electron beam apparatus, which comprises an electron source for providing an electron beam, a condenser lens for condensing the electron beam, a scanning unit for scanning the charged particle beam on a sample, a first objective lens below said condenser lens for focusing the electron beam, a maglev stage below the first objective lens for supporting the sample, a detector system for receiving signal electrons from the sample after the electron beam impinges on the sample, and a second objective lens, below said stage, including a central polepiece, being aligned to the charged particle beam and protruding to the sample, for focusing the charged particle beam on the sample. The stage includes two mesas movable in a first direction and a second direction orthogonal to the first direction, and an electrostatic chuck for supporting the sample. The two mesas have two openings respectively. The central polepiece protrudes through the two openings such that the central polepiece is located blow and adjacent to the electrostatic chuck.

In the present invention, the charged particle beam apparatus further comprises a retard electrode above the sample to retard the electron beam.

In the present invention, the charged particle beam apparatus further comprises a ferrite layer below said retard electrode to couple with a magnetic field generated by the second objective lens.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1A:
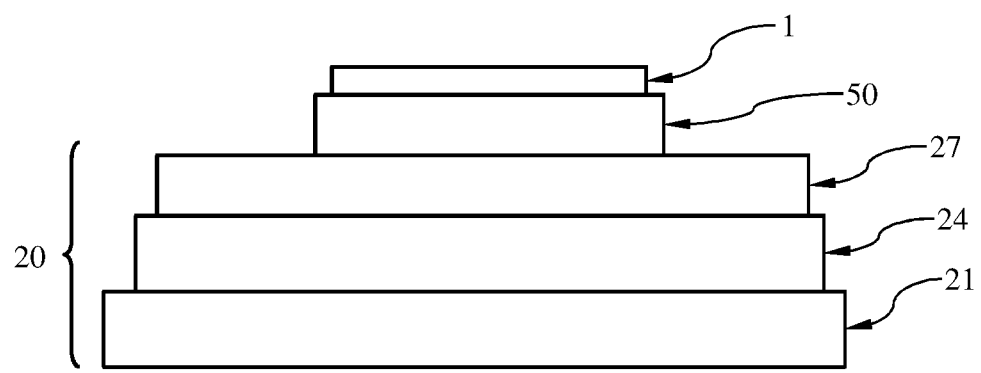
FIG. 1A and FIG. 1B illustrate cross sectional views of a conventional stage.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

As used herein, the term "wafer" generally refers to substrates formed of a semiconductor or non-semiconductor material. Examples of such a semiconductor or non-semiconductor material include, but are not limited to, monocrystalline silicon, silicon carbide, gallium arsenide, and indium phosphide. Such substrates may be commonly found and/or processed in semiconductor fabrication facilities.

One or more layers may be formed upon a wafer. Many different types of such layers are known in the art, and the term wafer as used herein is intended to encompass a wafer on which all types of such layers may be formed. One or more layers formed on a wafer may be patterned. For example, a wafer may include a plurality of dice, each having repeatable patterned features. Formation and processing of such layers of material may ultimately result in completed semiconductor devices. As such, a wafer may include a substrate on which not all layers of a complete semiconductor device have been formed or a substrate on which all layers of a complete semiconductor device have been formed.

The wafer may further include at least a portion of an integrated circuit (IC), a thin-film head die, a micro-electromechanical system (MEMS) device, flat panel displays, magnetic heads, magnetic and optical storage media, other components that may include photonics and optoelectronic devices such as lasers, waveguides and other passive components processed on wafers, print heads, and bio-chip devices processed on wafers.

The term, charged particle, is any particle positive or negative charged. The most used charged particle is negative charged particle which is electrons. However, other charged particles such as He nucleus, He, Li, Na, K, Cs, Al, Ga, In, Ag, Be, and Se ions, and Ag, Al, As, Au, B, Be, Bi, Ce, Co, Cr, Cs, Cu, Dy, Er, Ga, Ge, Hg, In, K, Li, Mg, Mn, Na, Nb, Nd, Ni, P, Pb, Pd, Pr, Pt, Rb, Sb, Si, Sm, Sn, U, Y, and Zn alloy ion sources, can be applied to the present invention. In the descriptions of the embodiments, only electron beam is mentioned. However, people skilled in the art could understand that charged particle can be applied to the present invention.

The terms, charged particle optics, in the present invention relate to optics by using electrostatic lens or magnetic lens to shape charged particles. And the terms, electron optics, refer to charged particle optics when source of the charged particle is electron.

The terms, electrostatic lens, refers to shape, collimate, or focus charged particle beams by using electrostatic field. The generation of the electrostatic field is by using electric poles or electrodes. And the terms, magnetic lens, refers to shape, collimate or focus charged particle beams by using magnetic field. The generation of the magnetic field is by using high magnetic conductive materials wound by excitation coils.

Turning now to the drawings, it is noted that the figures are not drawn to scale. In particular, the scale of some of the elements of the figures is greatly exaggerated to emphasize characteristics of the elements. It is also noted that the figures are not drawn to tie same scale. Elements shown in more than one figure that may be similarly configured have been indicated using the same reference numerals.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

Electromagnetic lens different from the conventional optical lens is that electromagnetic lens is a distribution of electric and magnetic field in space, not a real or solid lens. If the distribution of magnetic lens is identical to conventional immersion lens without real objective lens, the working distance can be released for adapting several kinds of detectors.

In the present invention, the real objective lens is configured below the stage, and magnetic lens is upward to immerse the sample surface. Conventional magnetic immersion lens immerses the magnetic field upside down to the sample, while the magnetic immersion lens of the present invention immerses the magnetic field downside upward to the sample surface.

Figure 1B:
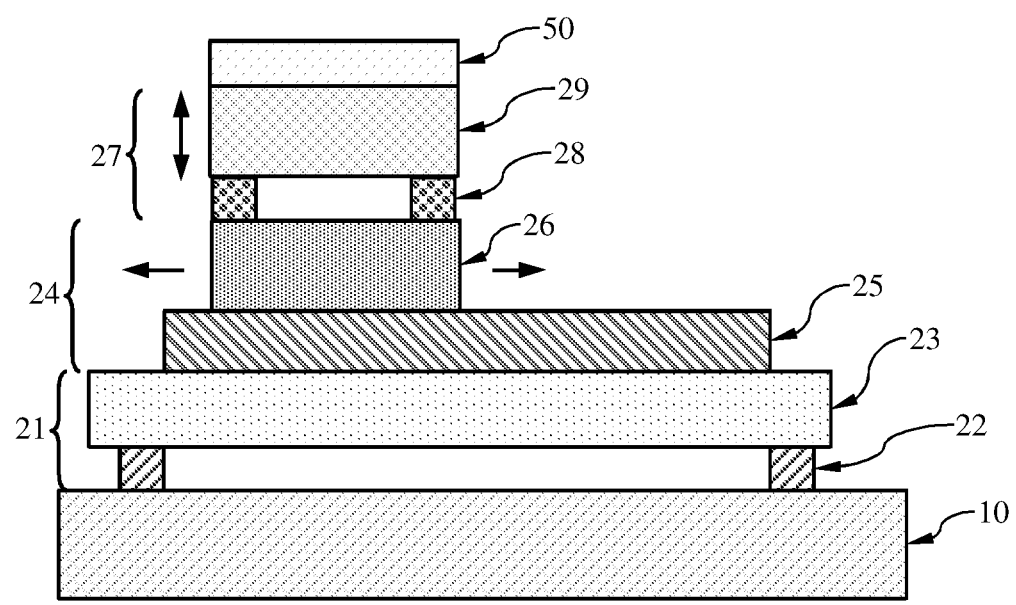
Figure 2A:
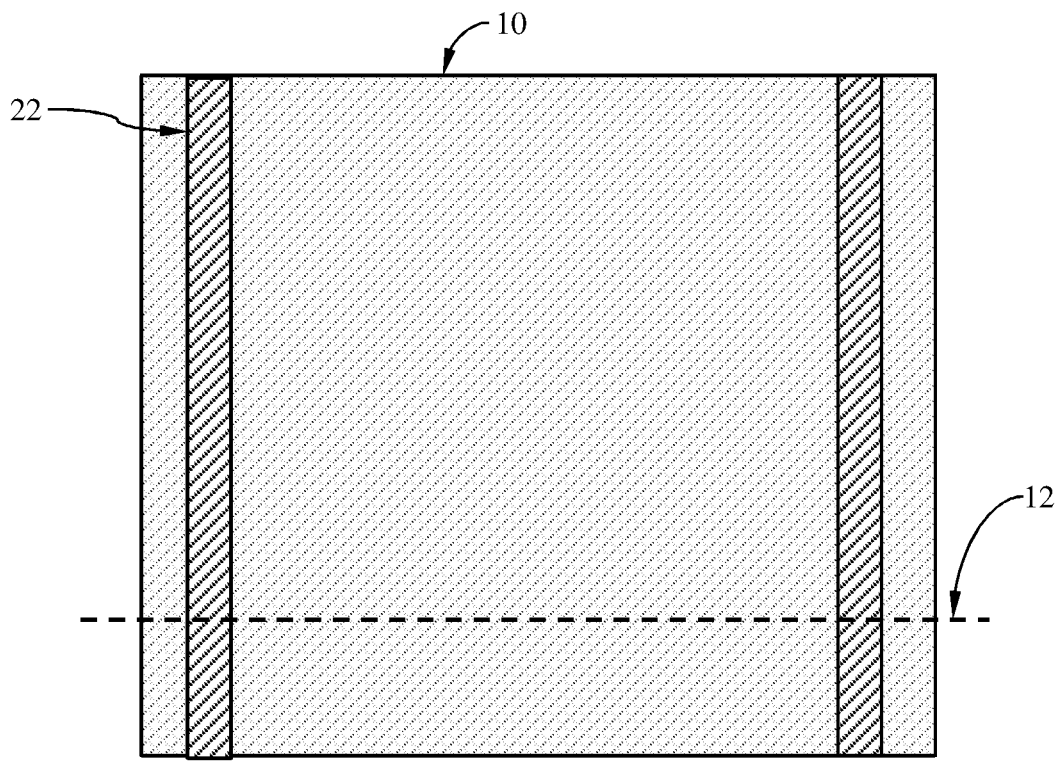
FIG. 2A to FIG. 2F illustrate top views of a conventional stage with detailed structure.
Figure 2B:
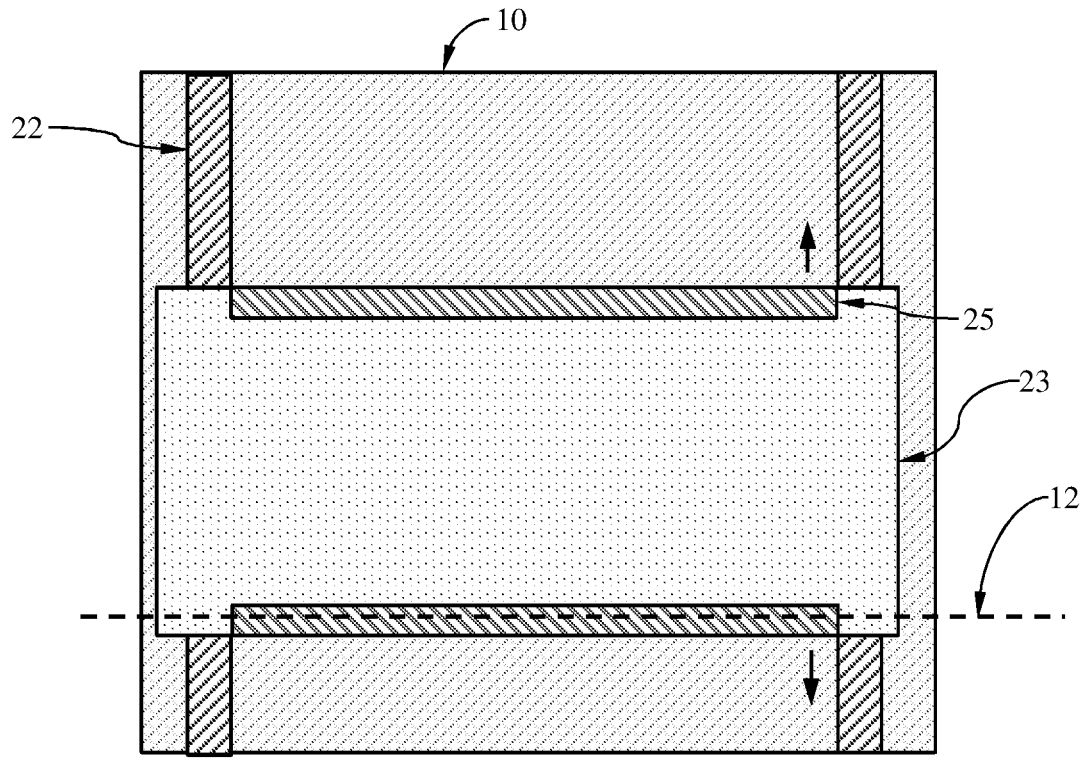
Figure 2C:
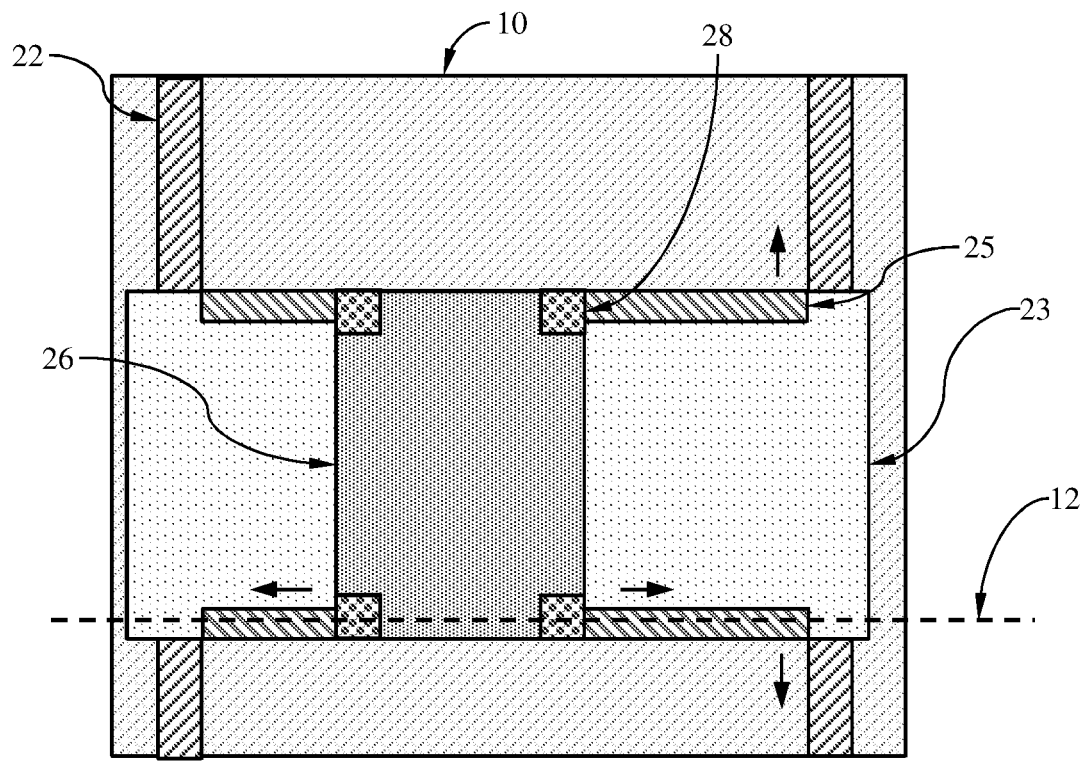
Figure 2D:
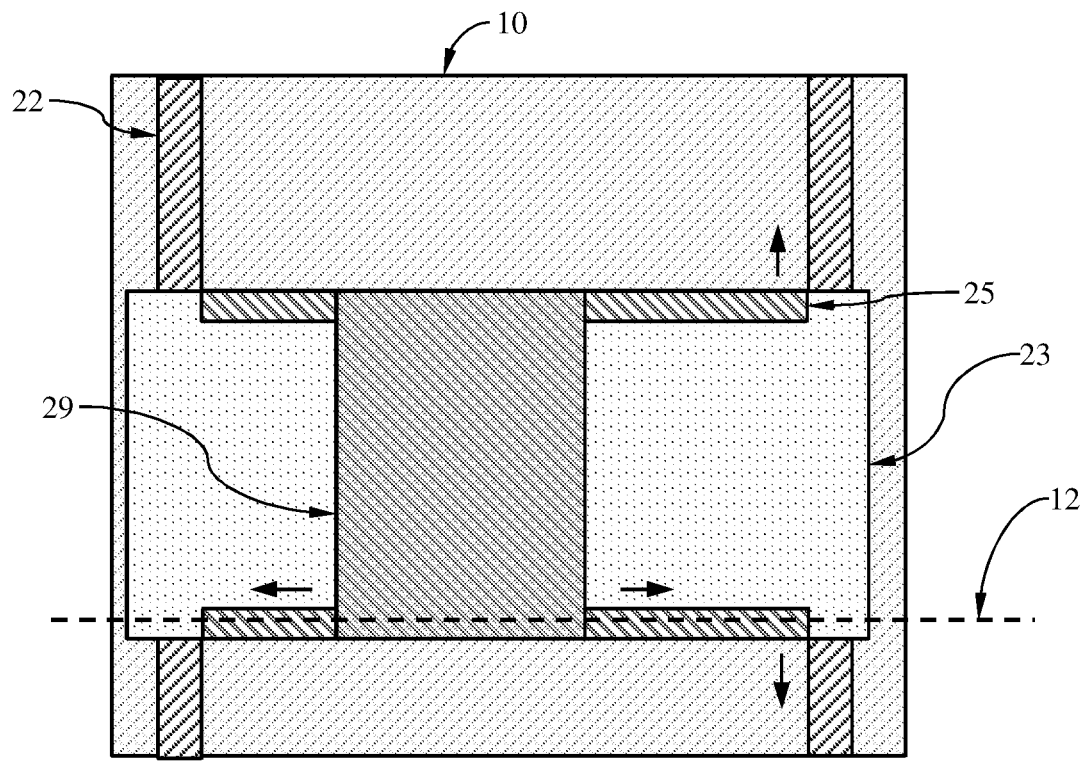
Figure 2E:
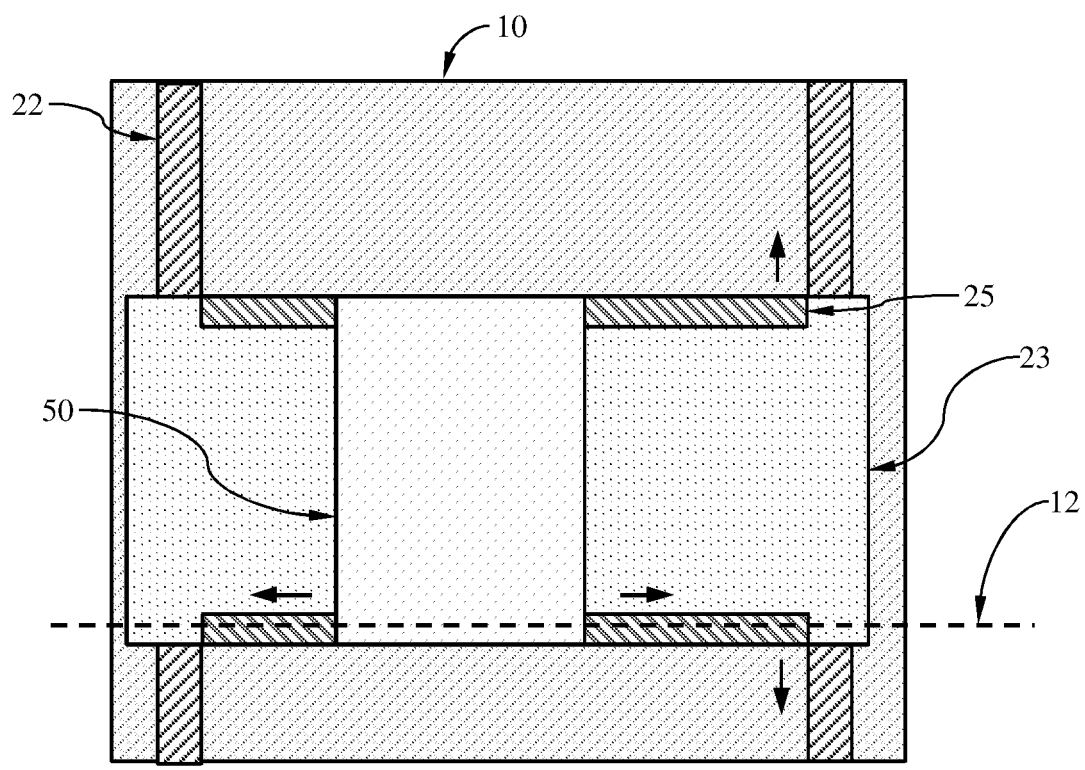
Figure 2F:
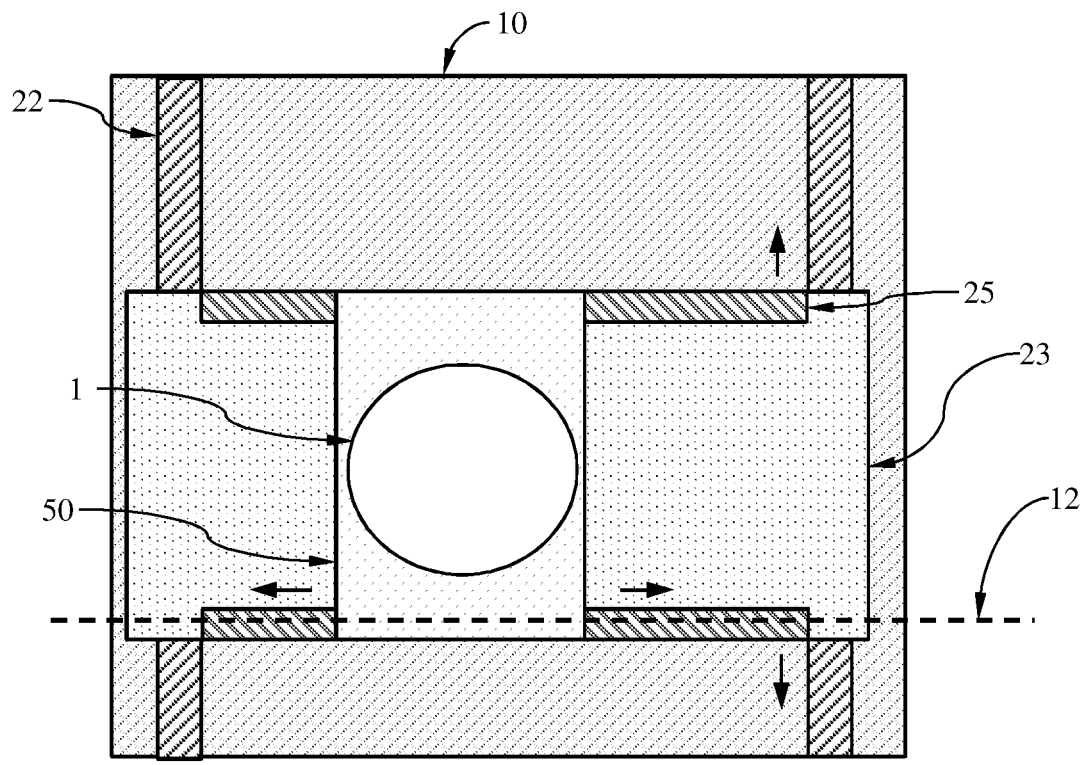

Conventional stage 20, as shown in FIG. 1A, includes an x stage 21, y stage 24, and z stage 27. The x stage 21 and y stage 24 moves horizontally, while the z stage 27 moves vertically. An electrostatic chuck (E chuck) 50 above the z stage 27 mounts the wafer 1. Detailed structure of the stage can be referred to FIG. 1B. A stage 20 is configured on a base 10. The x stage 21 includes an x rail 22 and an x mesa 23 movable in x direction on the x rail 22. The y stage 24 includes a y rail 25 configured on the x mesa 23 and a y mesa 26 movable in y direction on the y rail 25. The z stage 27 on the y stage 24 includes a piezoelectric actuator 28 on the y mesa 26, and a z mesa 29 on the piezoelectric actuator 28. The E chuck 50 will be configured on the z mesa 29.

The top view of the conventional stage 20 can be referred to FIG. 2. Base 10 and x rail 22 on the base 10 can be shown in FIG. 2A, and cross sectional line 12 refers to sectional illustration in FIG. 1B. Please refer to FIG. 2B, x mesa 23 is mounted on the x rail 22, and the y rail 25 is mounted on the x mesa 23. Please refer to FIG. 2C, y mesa 26 is mounted on the y rail 25, and four piezoelectric actuators 28 are mounted on the four corners of the y mesa 26. Please refer to FIG. 2D, z mesa 29 is mounted on the four piezoelectric actuators 28. Please refer to FIG. 2E, the E chuck 50 is mounted on the z mesa 29. Please refer to FIG. 2F, wafer 1 is mounted on the E chuck 50. The E chuck 50 in the drawings is rectangular, but some E chuck is circular.

Due to there are structures inside the stage, magnetic field can't be immersed upward easily if the objective lens is configured below the stage. Hence, most structures of the stage are evacuated to configure the objective lens, and this kind of stage will be some different to conventional stage.

Figure 3A:
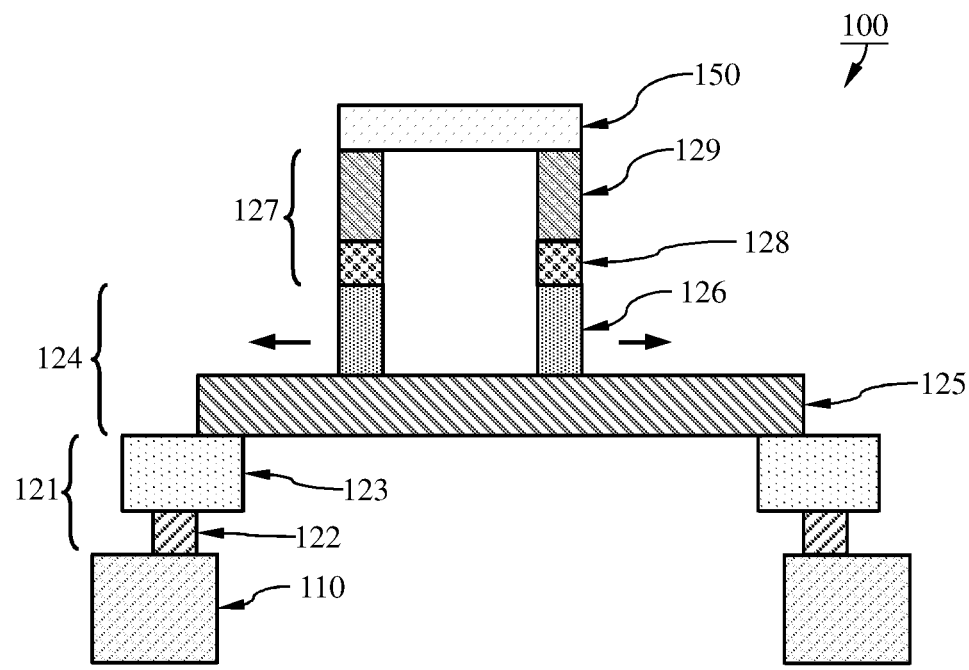
FIG. 3A and FIG. 3B illustrate cross sectional views of a stage in accordance with one embodiment of the present invention.
Figure 3B:
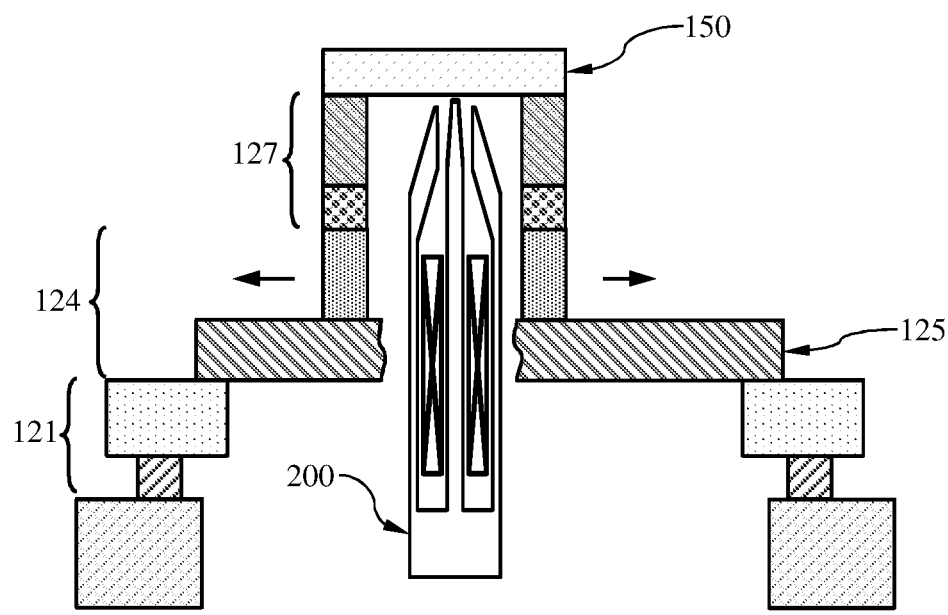

Please refer to FIG. 3A, it shows a cross sectional view of the stage according to the instant invention, which includes a x-axis moving mechanism 121, a y-axis moving mechanism 124, and a z-axis moving mechanism 127. The x-axis moving mechanism 121 includes the x rail 122 and the x mesa 123. The y-axis moving mechanism 121 includes the y rail 125 and the y mesa 126. The z-axis moving mechanism 127 includes the piezoelectric actuator 128 and the z mesa 129. The base 110, x mesa 123, y mesa 126 and z mesa 129 are evacuated with openings there inside respectively, while the x rail 122, y rail 125, and piezoelectric actuator 128 are the same to the conventional stage. E chuck 150 is mounted on the z mesa 129. Please refer to FIG. 3B, the objective lens 200 is configured below the E chuck 150. The central polepiece of the objective lens 200 or the objective lens 200 per se can protrude through the openings of the x mesa 123, y mesa 126, and z mesa 129, such that the central polepiece of the objective lens 200 can be located below and adjacent to the electrostatic chuck 150.

The xy rail in FIG. 3 is conventional linear motor, and popular in the semiconductor equipment. However, the SEM is operated in the vacuum environment, and the lubrication oil is necessary for linear motor operation, while the lubrication oil will be consumed in the vacuum environment. Moreover, cogging between stators and unrolled rotors in the linear motor will deteriorate image when resolution of the SEM is larger and larger. Maglev stage would be suitable for the SEM.

Figure 4:
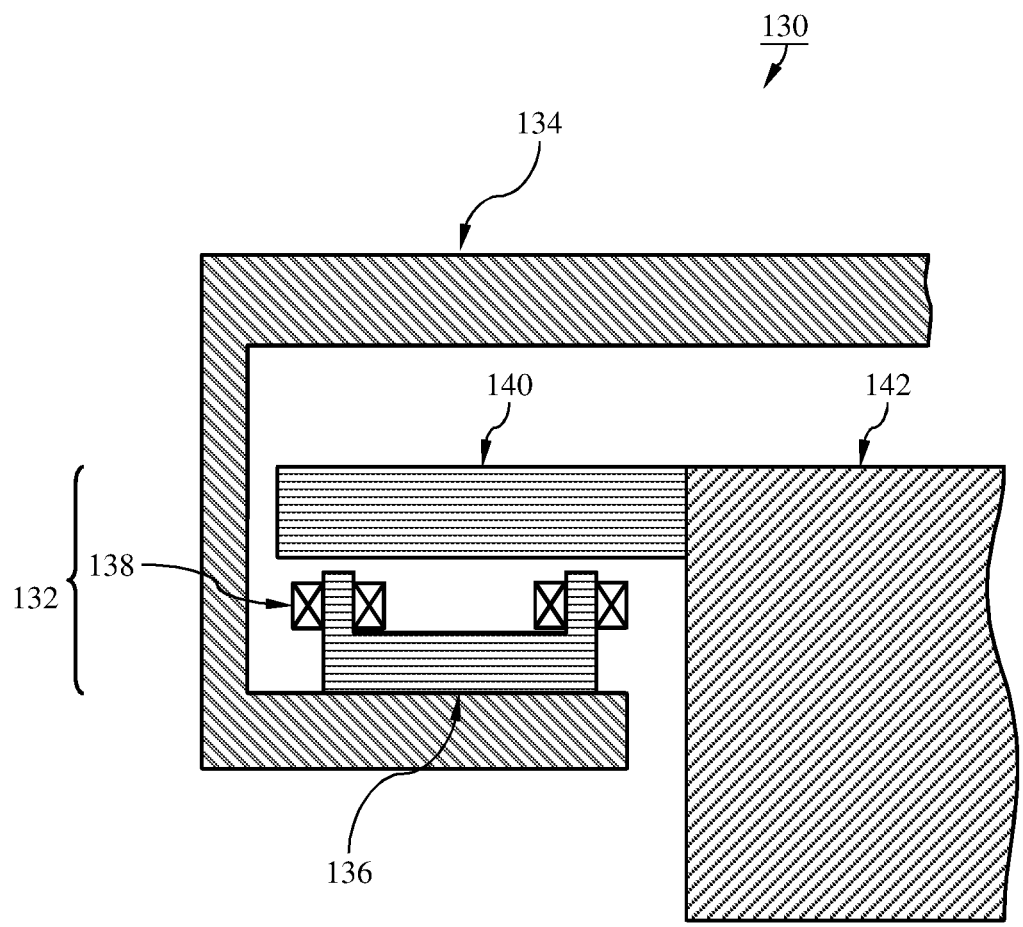
FIG. 4 illustrates a cross sectional view of a rail in a maglev stage.
Figure 5A:
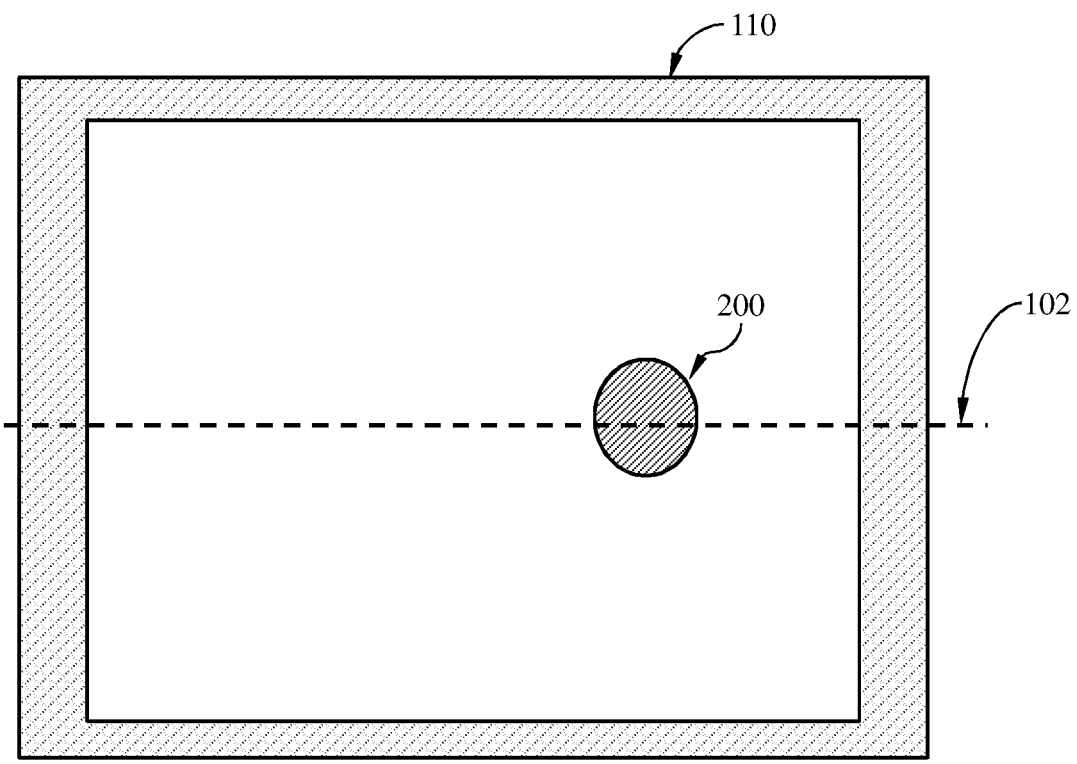
FIG. 5A to FIG. 5E illustrate top views of a stage with detail structure in one embodiment of the present invention.
Figure 5B:
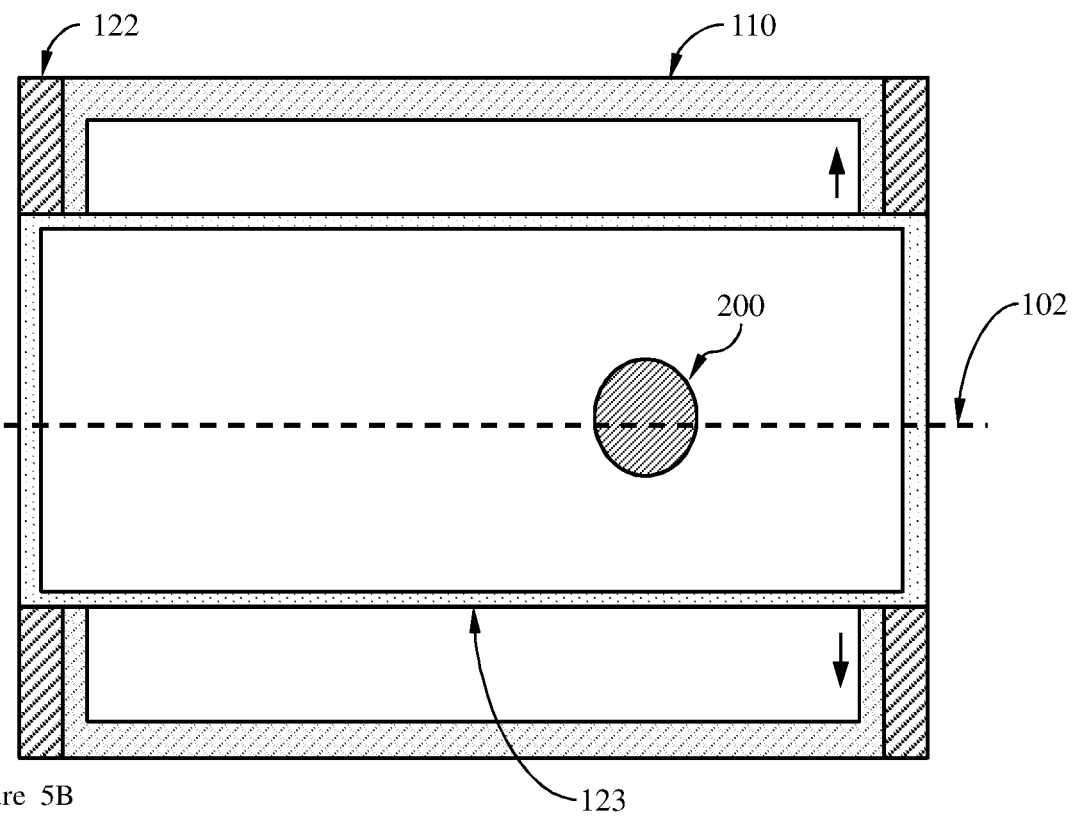
Figure 5C:
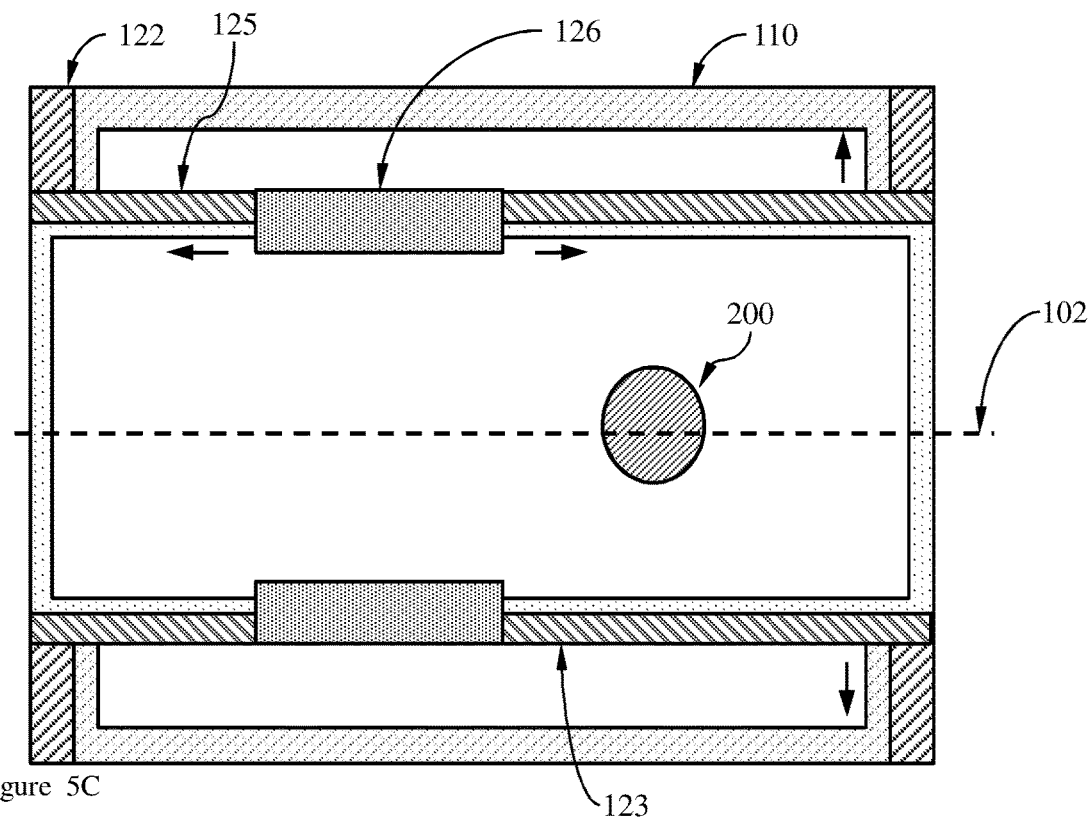
Figure 5D:
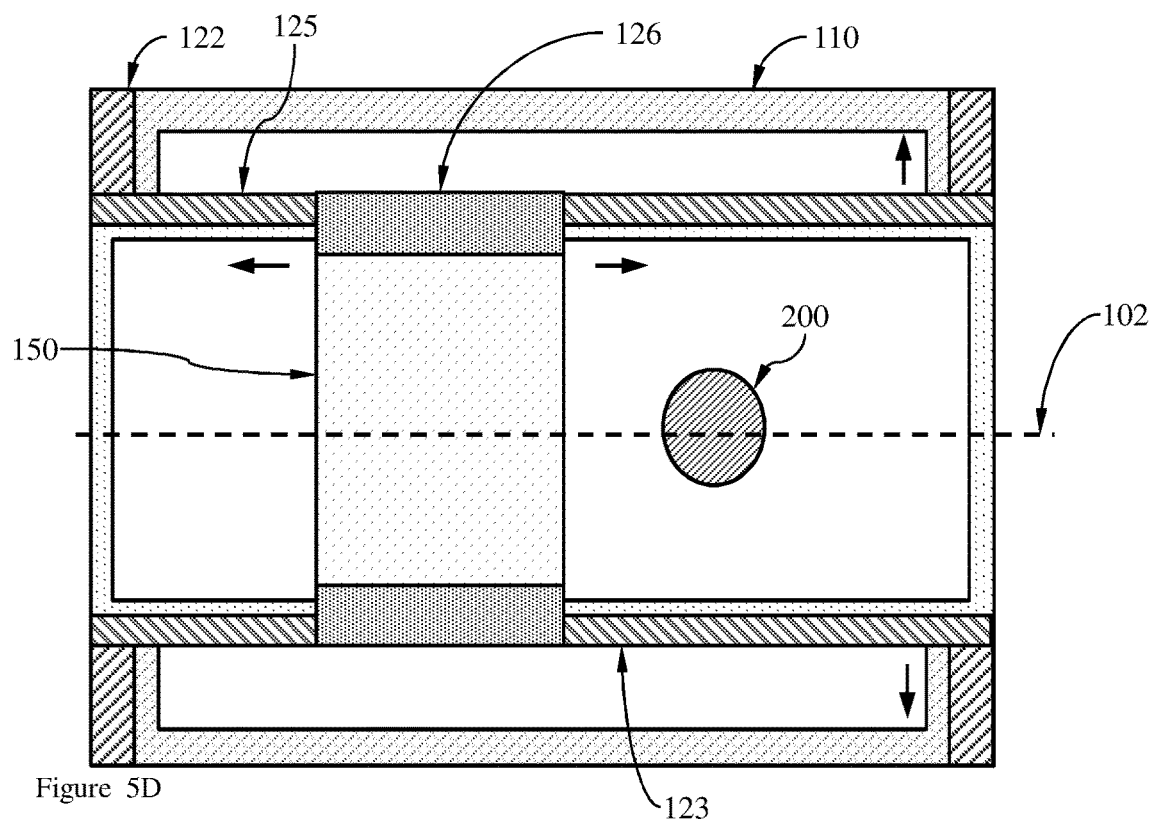
Figure 5E:
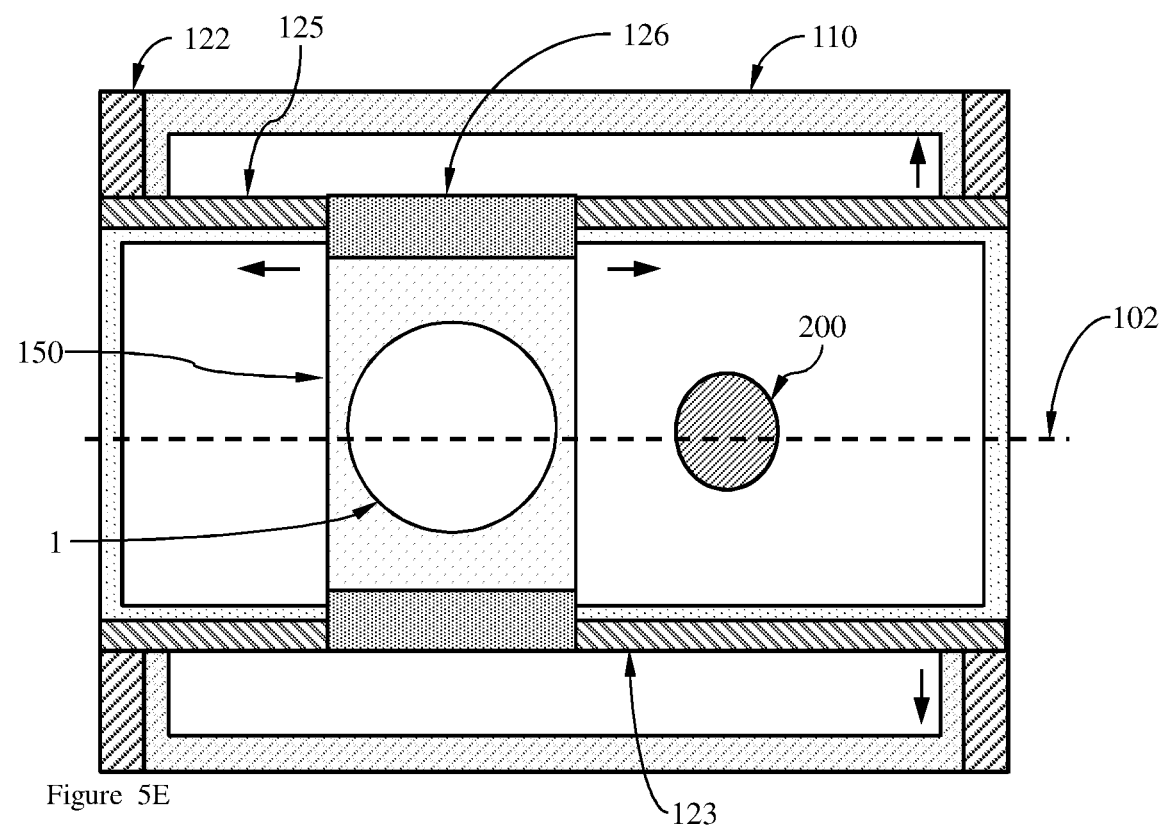

Please refer to FIG. 4, a maglev rail 132 of a maglev stage 130 is shown, in which maglev rail 132 includes a yoke 136, excitation coil 138, and high magnetic conductive plate 140. The base 142 fastens to the high magnetic conductive plate 140, and a movable mesa 134 fastens to the yoke 136 with excitation coils 138 rounding the yoke 136. When there is no electric current in the excitation coil 138, the movable mesa 134 will lie on the base 142 directly. When the electric current passes through the excitation coils 138, magnetic force line will be generated from yoke 136 to the high magnetic conductive plate 138, and the movable mesa 134 is thus lifted; that's magnetic levitation. When the movable mesa 134 is lifted, the movable mesa 134 can be moved along the rail by controlling the current of the excitation coils 138. Due to the movable mesa 134 is levitated, and there is no contact with the base 142, there will be no friction and cogging in the linear motor. That would be better in the resolution for the SEM. Moreover, maglev stage can lift the movable mesa 134, the movable mesa 134 can be moved in the z direction, and there is no necessary further z stage. For conventional xy stage of linear motor, a z stage of piezoelectric actuator is necessary. Hence, if maglev stage is applied to the present invention, the whole structure will be simpler. Furthermore, due to most magnetic force lines will be close loop inside yoke 136 and the high magnetic conductive plate 140, magnetic field leakage is less than the earth magnetic field and will not deteriorate the image of the SEM. Compared to stator and motor of conventional linear motor, all magnetic force line are opened and another iron plate is necessary to enclose all magnetic force lines to avoid affecting the electron beam in SEM. A conventional maglev stage can be referred to U.S. Pat. No. 5,732,636.

Please refer to FIG. 5 that detailed structures of top views of maglev stage are shown. Please refer to FIG. 5A, a base 110, in a shape of a frame, with a center opening and an objective lens 200 inside the opening are shown, wherein a cross sectional line 102 will illustrate cross sectional structure in FIG. 6. Please refer to FIG. 5B, x rail 122 is mounted on the base 110, and x mesa 123 is mounted on the x rail 122, wherein the x rail is maglev and the x mesa 123 includes an opening to fit the objective lens 200. Because the objective lens 200 is fixed, the movable x mesa 123 will not engage with the objective lens while it moves along the x rail 122. Please refer to FIG. 5C, y rail 125 is mounted on the x mesa 123, and y mesa 126 is mounted on the y rail. Due to the objective lens protrudes towards the wafer, the y mesa 126 in this embodiment is halved into two pieces to provide an opening in between not to engage with the objective lens 200. Another way is to provide an ultrathin y mesa 126 and altitude is higher than the objective lens 200. Please refer to FIG. 5D, the E chuck 150 is mounted on the two halves of the y mesa 126. The altitude of the E chuck 150 is higher than the objective lens 200, and the E chuck 150 will not engage with the objective lens 200. Please refer to FIG. 5E, the wafer 1 will be mounted on the E chuck 150 for defect inspection.

Figure 6A:
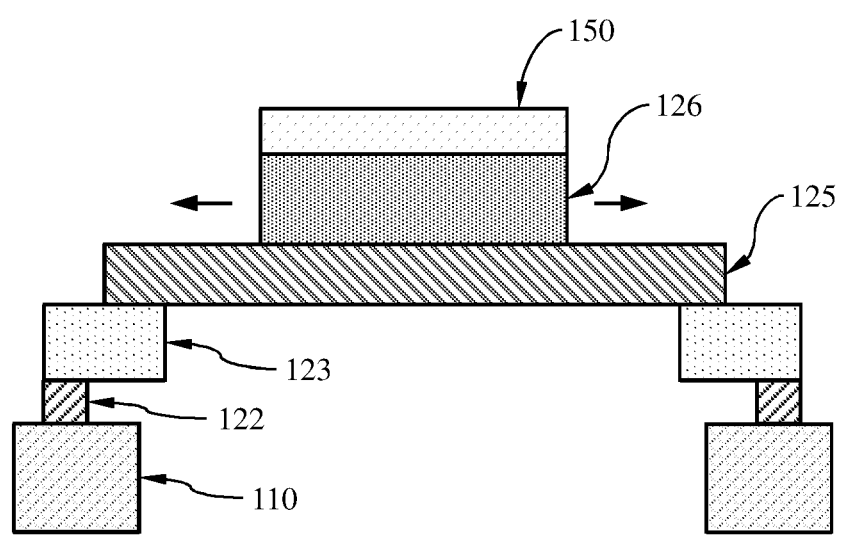
FIG. 6A and FIG. 6B illustrate cross sectional views of a stage in accordance with another embodiment of the present invention.
Figure 6B:
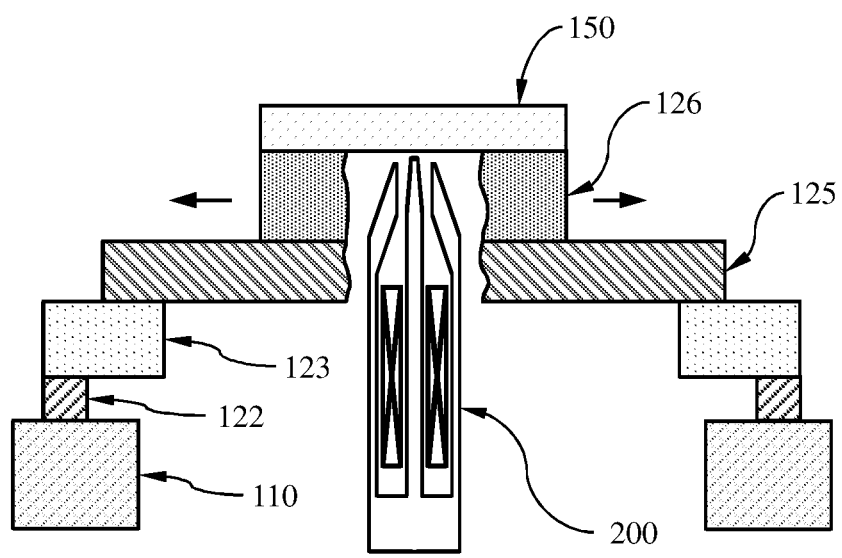

Please refer to FIG. 6A, in which a cross sectional view of stage structure along the cross sectional line 102 in FIGS. 5A-E is shown; referring to FIG. 6B, wherein the objective lens 200 fits in the opening of the base 110. Although both y rail 125 and y mesa 126 are not on the cross line 102, the y rail 125 and the y mesa 126 are shown as viewing from the cross sectional line 102. Structure of the stage is simpler due to no z stage. As illustrated in FIG. 6B, the objective lens 200 is located below the stage. The central polepiece of the objective lens 200 or the objective lens per se protrudes the openings of the x mesa 123 and y mesa 126, such that the central polepiece of the objective lens 200 or the objective lens per se is below and adjacent to the electrostatic chuck 150.

When the stage is improved, the conventional objective lens can be applied to the present invention, but an improved objective lens can be provided for better focusing capability. First, for conventional objective lens, in order to provide larger focusing power, a larger excitation current is provided. However, the excitation coils will incur larger impedance for larger excitation current, and the objective lens will be heater. The Yoke of the objective lens will be reshaped due to the heats, and the magnetic field distribution is also changed therefore. The focusing power is thus deteriorated and aberration is incurred. Another way is to provide more excitation coils, and volume of the objective lens is thus increased. The larger volume objective lens will prevent from detectors installed inside the objective lens. If the objective lens can be configured below the stage, the volume issue will no more exist. Thus, more excitation coils can be provided for more magnetic fields generated. Moreover, in the semiconductor facility, the objective lens is hanged on the housing of the facility, and vibration issue still exists, while specific tools are required to hang the heavy objective lens when the SEM need maintain services. In the present invention, because the heavy objective lens can be installed on the ground base, except the less vibration issue, it is much easier to maintain the facility, especially for maintaining the stage only.

Moreover, the conventional objective lens is constituted by a cylindrical symmetrical yoke with high magnetic conductive material, and excitation coils inside the yoke. In the central of the yoke will have a cylindrical opening to let the electron beam pass therethrough. If the objective lens is configured below the stage, the cylindrical opening is no more necessary. Thus, the central polepiece can provide a magnetic field similar to a magnetic monopole to focus the electron beam, and one magnetic force line is provided along the electron beam. Compared to conventional objective lens, there is no magnetic force line along the electron beam. This kind of magnetic force line along the electron beam will provide better focusing power.

Figure 7A:
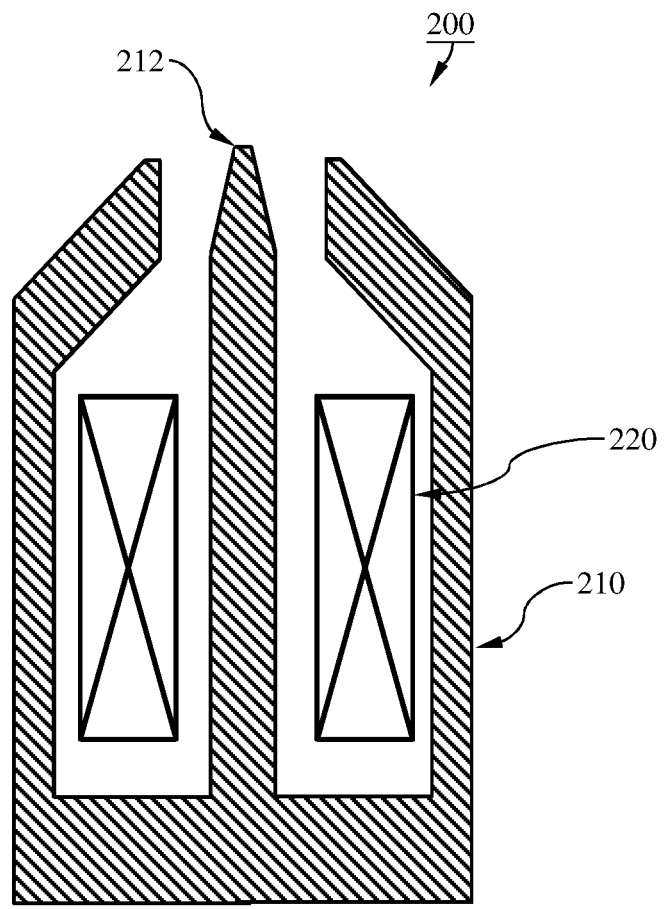
FIG. 7A to FIG. 7E illustrate cross sectional views of an objective lens in accordance with several embodiments of the present invention.
Figure 7B:
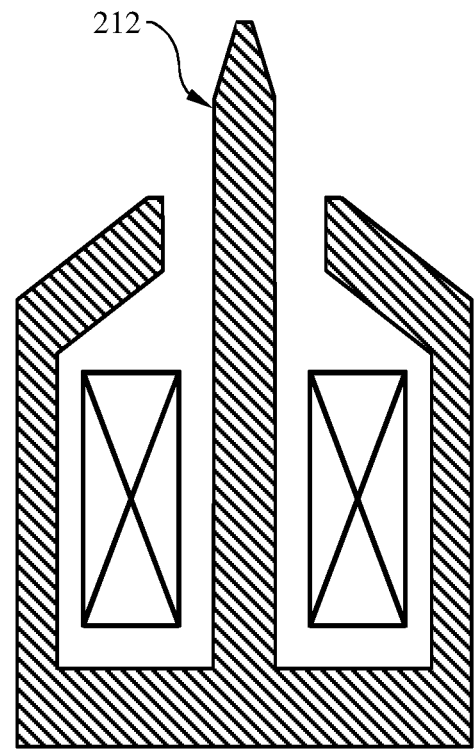
Figure 7C:
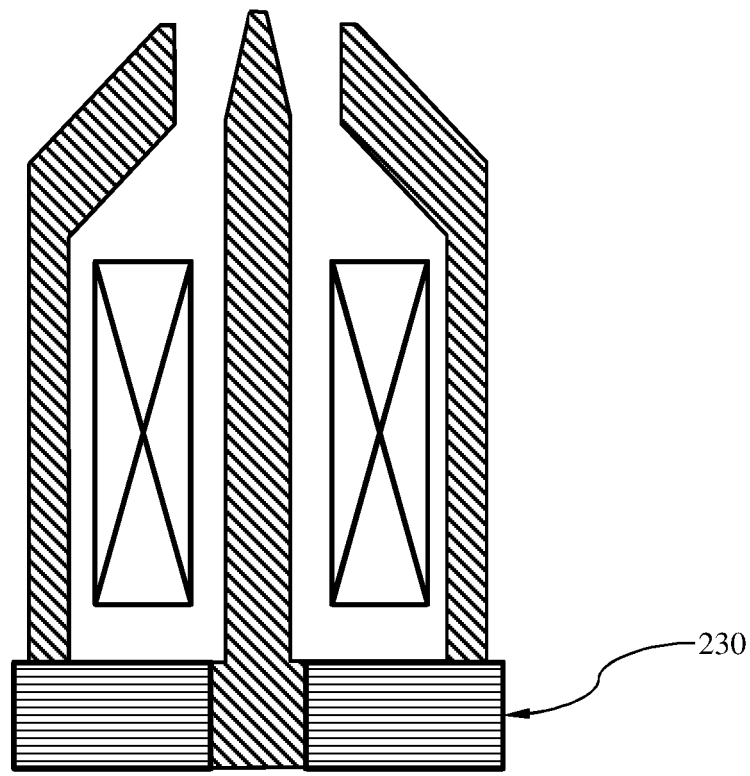
Figure 7D:
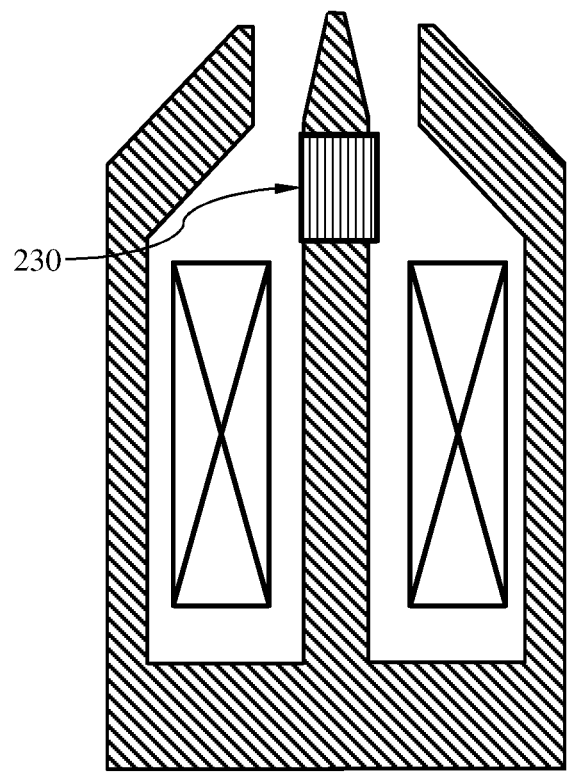
Figure 7E:
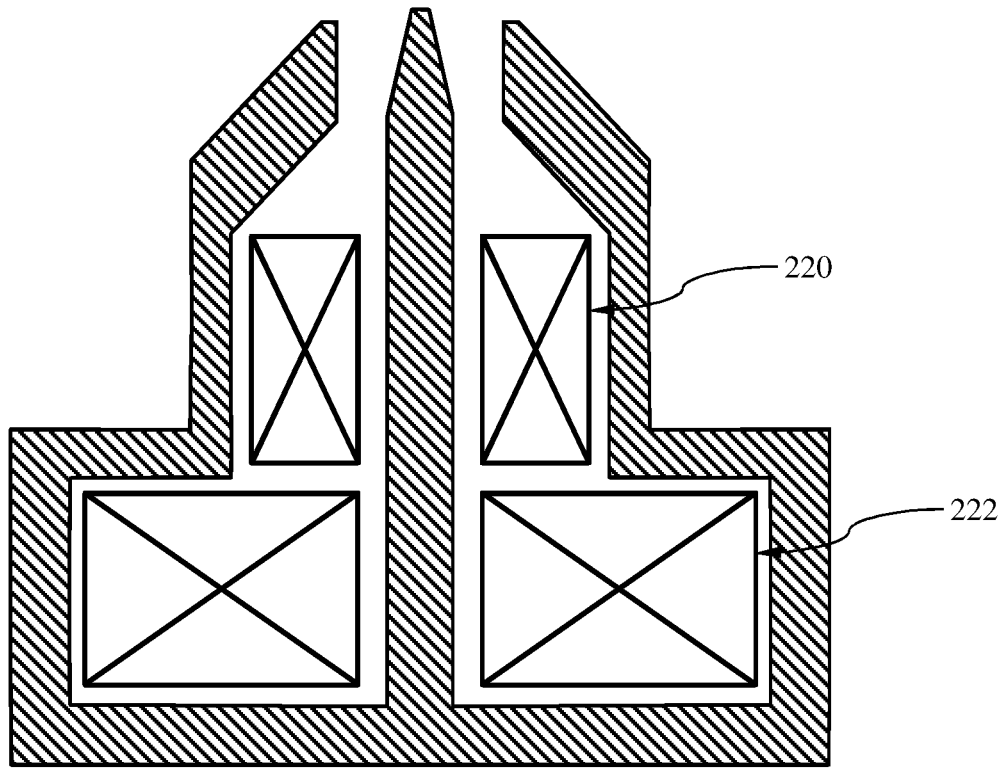

Please refer to FIG. 7A to show the present invention of the objective lens 200. The objective lens 200 includes a yoke 210 with a central polepiece 210 and an excitation coil 200. The central polepiece 212 in the present invention does not include cylindrical opening for electron beam passing through, and hence the top of the central polepiece 212 can be similar to magnetic monopole; that is a magnetic force line will be emitted along the electron beam. Such a design will make the electron beam focused by this magnetic force line along the optical axis. Compared to the conventional objective lens, there is no such a magnetic force line along the optical axis. The objective lens of the present invention may be varied in different designs. Please refer to FIG. 7B, the central polepiece 212 can protrude much more to make magnetic monopole more obviously. Please refer to FIG. 7C, permanent magnet 230 can be configured in the yoke 210 to provide constant magnetic field such that current provided for the excitation coil can be lowered. Please refer to FIG. 7D, the permanent magnet 230 can be configured to the bottom of the central polepiece 212. If more magnetic fields are necessary, a second excitation coil 222 can be provided, as shown in FIG. 7E. Because the objective lens 200 is configured below the stage, larger volume of the objective lens will not affect space above the wafer. Compared to conventional SEM, a large objective lens will generate some issues to the detectors.

Figure 8:
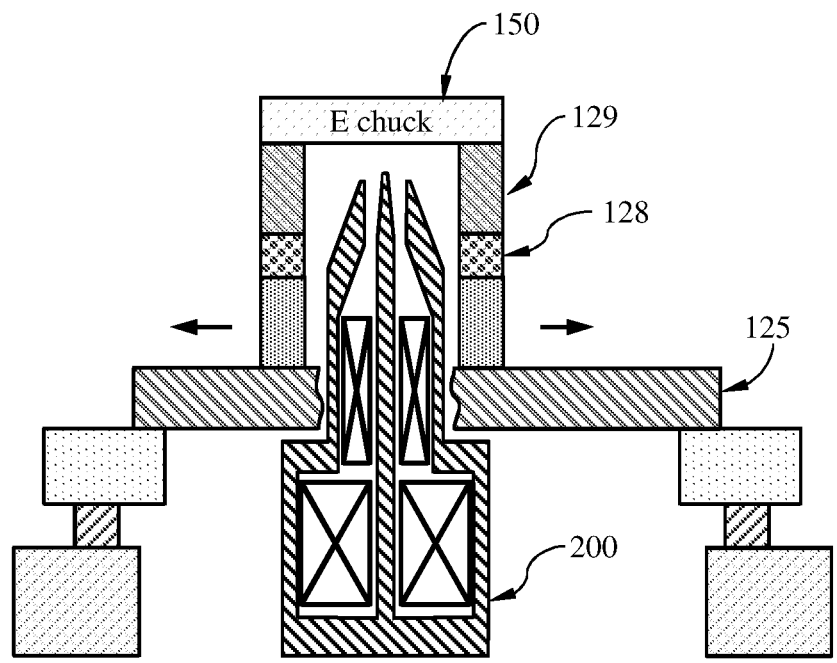
FIG. 8 illustrates a cross sectional view of an objective lens below the stage in accordance with another embodiment of the present invention.

Please refer to FIG. 8 to illustrate the objective lens in the FIG. 7E below the stage. There will be more excitation coils if larger magnetic fields are necessary. Excitation coils at bottom can be much more to occupy more space, while less excitation coils at top to occupy less space to lower openings in the stage. Strain and stress of the stage with openings will be worse, so it is important to reduce each opening in the stage.

Figure 9:
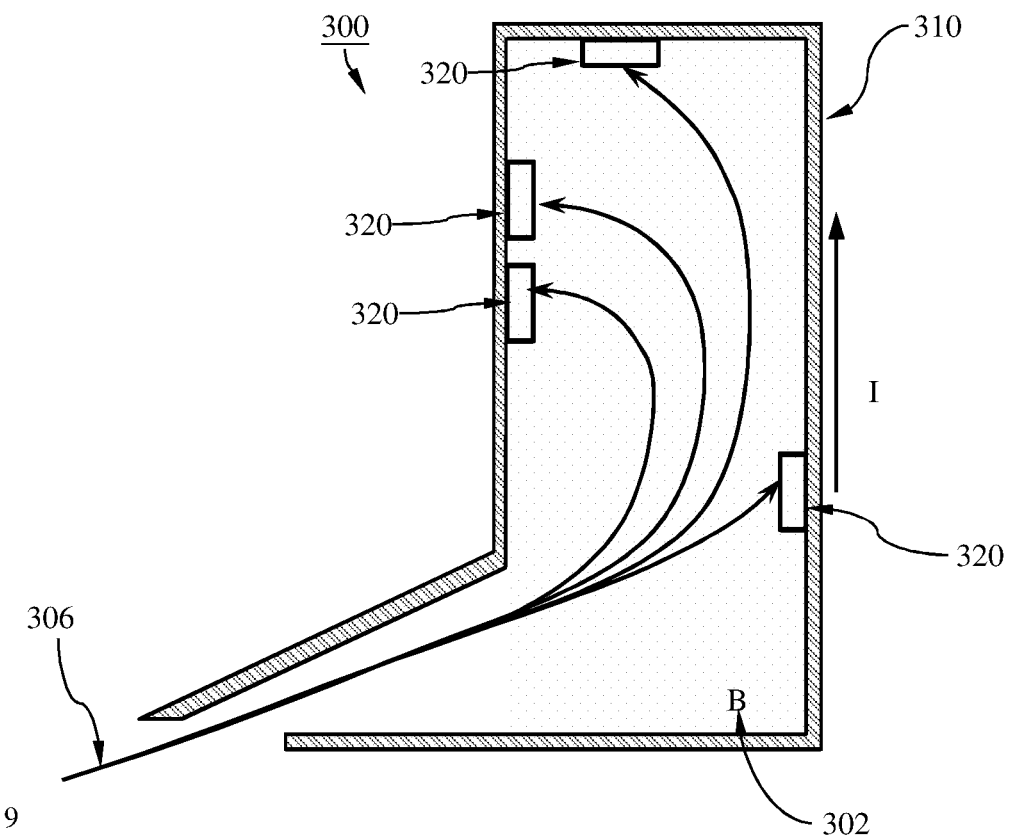
FIG. 9 illustrates a cross sectional view of AE detector in accordance with one embodiment of the present invention.

FIG. 9 illustrates an Auger electron (AE) detector 300. The AE detector is used to identify materials of the sample by observing AE spectrum. Current SEM applied to the defect inspection can only detect secondary electron (SE), and only surface topography information can be obtained. If information of materials on the sample is necessary, back-scattered electron (BSE) image should be provided. However, the BSE image can provide relative atomic numbers in the sample, and exact material in the sample is still unknown. AE can provide exact material by comparing AE spectrum. Please refer to FIG. 9, a current I is provided in a housing 310, such that a magnetic field 302 is provided inside the housing 310. After entering the housing 310, AE 306 with large angles will be deflected by the magnetic field 302 with curved track. Radius of the curve is determined by the velocity of AE 306 and intensity of the magnetic field 302. Different detectors are configured at different positions to detect different energies of AE. When the AE spectrum is plotted, materials in the sample can be determined.

Figure 10A:
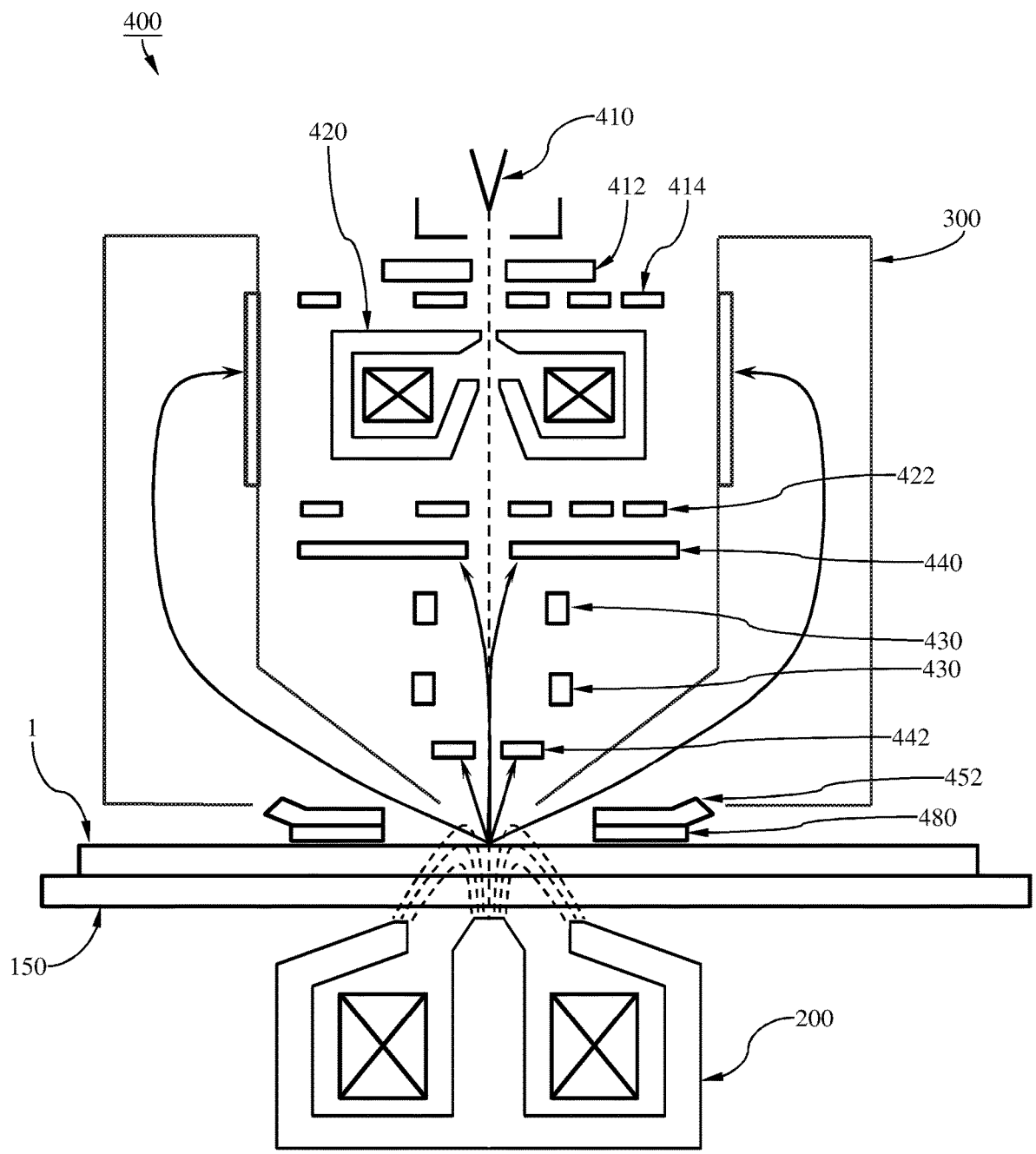
FIG. 10A to FIG. 10C illustrate cross sectional views of SEM in accordance with several embodiment of the present invention.
Figure 10B:
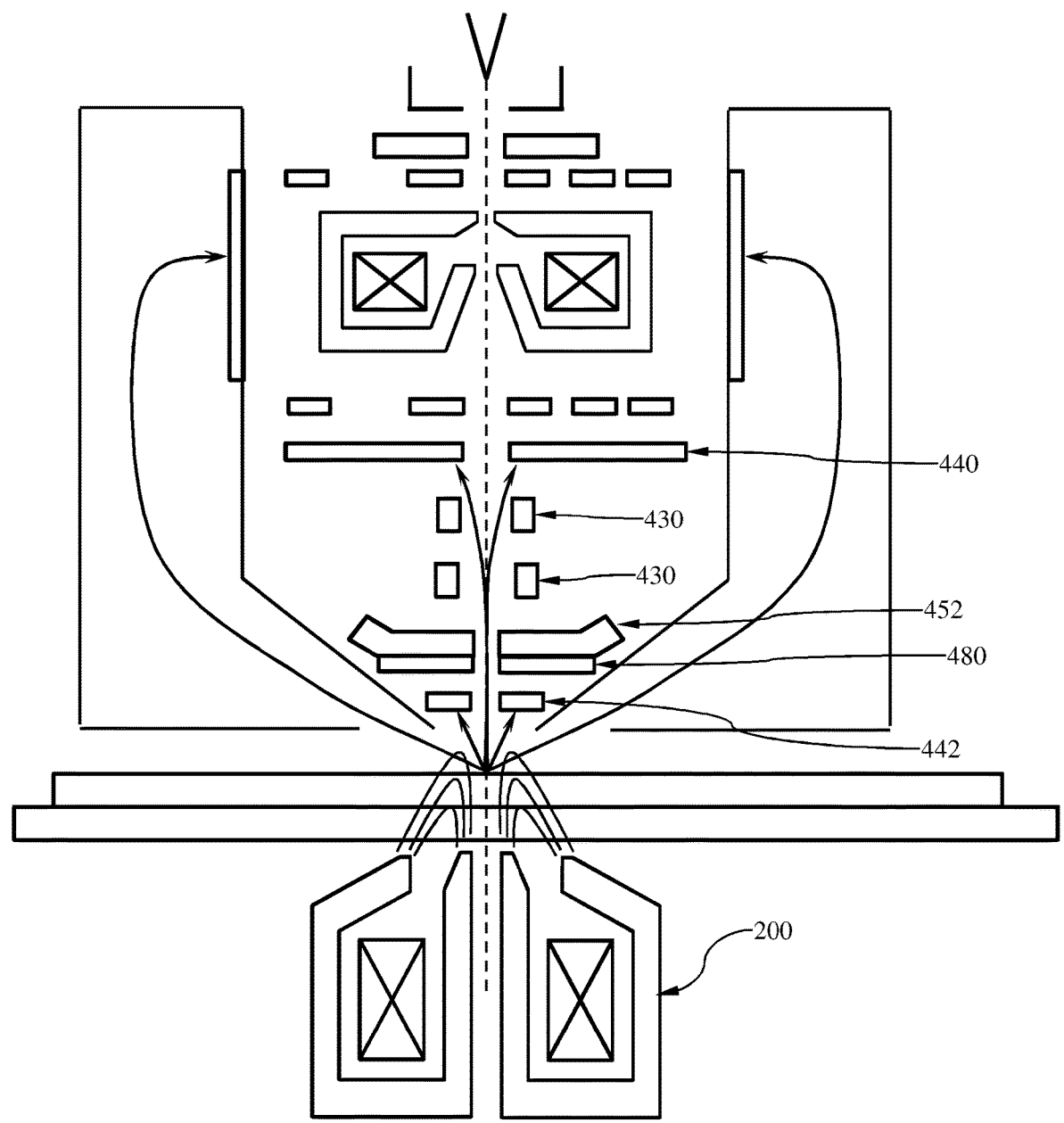

FIG. 10 illustrate an improved objective lens to a SEM. Please refer to FIG. 10A that a SEM 400 is provided in the present invention. An electron source 410 is cathode per se for providing an electron beam. The anode 412 provides enough electric field to attract electrons away from the electron source 410. In the present invention, conventional thermionic electron source or cold field emitter can be applied to the present invention. In an embodiment, the Schottky emitter is preferred, which a tungsten tip is welded to a tungsten filament with ZrO coated on the tungsten emitter. When the tungsten filament is heated, the anode 412 also provide enough electric field to attract electrons from the tip of the tungsten tip, and the ZrO will lower work function of the tungsten to enhance efficiency of providing the electron beam. The Schottky emitter includes all advantages of the thermionic emitter and the cold field emitter while avoid both drawbacks. Hence, the Schottky emitter is the mainstream in the SEM.

A selectable aperture plate 414, below the anode 412, lowers Coulomb compel force in the electron beam. The selectable aperture plate 414 includes several apertures with different sizes such that different beam currents can be passed through. When a large beam current is necessary, large aperture in the selectable aperture plate 414 is used. When a small beam current is required, small aperture on the selectable aperture plate 414 can be used to trim beam current close to the anode 412. Thus, aberration caused by Coulomb compel force can be avoided.

A condenser lens 420, below the selectable aperture plate 414, condensing the electron beam. In the present invention, the condenser lens is a magnetic lens, but the electrostatic lens is also applicable. However, compound electromagnetic lens is also applicable and preferred for less aberration. For large beam current in SEM, there will be no crossover formed below the condenser lens, due to Coulomb compel force will explode at the crossover. Hence, the condenser lens 420 only condenses the electron beam. A beam current adjustable plate 440, below the condenser lens 420, determines beam current of the electron beam. Structure of the beam current adjustable plate 440 is similar to the selectable aperture plate 414, which includes several apertures on a plate. In SEM, beam current is determined at this position.

A scanning unit 430 will scan the electron beam on the sample. Scanning unit 430 is a paired deflectors which deflects electron beam. If a single deflector is used for scanning the electron beam and not superposed with the objective lens, the paraxial aberration is incurred. However, the magnetic lens is immersed from bottom upward and single deflector can't be applicable as scanning unit in the present invention.

A retard electrode 452, below the scanning unit 430, to lower velocity or energy of the electron beam. The electrons away from the anode 412 has high energy to avoid aberration incurred by Coulomb compel force for large beam current. The retard electrode 452 will lower the electron beam in advance and then is landed on the sample or wafer surface 1. Current SEM applicable to the defect inspection will employ low landing energy of the electron beam, less than 1500 eV. The electrons away from the anode will have the energy about 15 KeV for large beam current, so the wafer should be applied to at least 13.5 KeV to adjust landing energy less than 1.5 KeV. However, the wafer 1 is applied such a high voltage will arcing to the device above the wafer, and in this embodiment the BSE detector will be damaged. The retard electrode 452 in this position may protect the BSE detector from damaging.

In the present invention, the objective lens 200 locates below the E chuck 150. In order to raise magnetic field as possible as higher to the sample surface, a ferrite layer 480 formed below the retard electrode 452 will couple to the magnetic field generated by the objective lens 200; that is magnetic force line generated by the objective lens will couple to the ferrite. Thus, the magnetic lens is raised upward. Ferrite is a ceramic material composed of mainly iron oxide.

When the wafer 1 is impinged by the electron beam, several different signal electrons are generated, in which BSE has higher energy with less dose. Therefore, the BSE detector 442 always allocates near the sample. In one embodiment of the present invention, the BSE detector is positioned between the retard electrode 452 and the scanning unit 430. The secondary electrons, although has smaller energy, has very large dose compared to the BSE, so the SE detector 440 can be located at higher position. In one embodiment of the present invention, the SE detector 440 is positioned between beam current adjustable plate 440 and the scanning unit 430. In the present invention, both the BSE of SE detector can be Everhart-Thornley (ET) detector, photomultiplier tube (PMT) detector, or semiconductor diode detector (SDD). Due to there is no objective lens above the sample, the empty space over there can be reserved for several kinds of detectors. Furthermore, X-ray detector can be applicable in the present invention for detecting materials of the sample surface.

In the present invention, the large emitting AE can be collected by the AE detector 300. Due to AE detector 300 needs magnetic field to analyze AE with different energies, volume of the AE detector is very large compared to other detectors. Hence, in the present invention, large emitting AE would be suitable to be collected. In the present invention, because large beam current is applied, the dose of signal electrons can also be increased for signal receiving and analysis, of course including AE.

An informative result can be provided if collected SE image, BSE image, and AE spectrum can be integrated. For example, conventional SE image can only provide grey level to represent topography of a wafer. However, BSE image can tell different materials on the sample surface, and different materials can be assigned colors. In the nanometer scale image, color is meaningless due to less than the visible wavelength, but some particular defect can be identified easily if some color is assigned to a specific material. Furthermore, at the edge of a pattern, SE dose will be released inherently and thus boundary of the pattern is always very bright. Thus, to identify dimension of a pattern is not easy if only SE image is available. Boundary can be defined clearly if material information is also collected.

Furthermore, the outer housing of the AE detector 300 is grounded, while the retard electrode and the wafer are applied different voltages. All three components can constitute an electrostatic lens to lower aberration. A compound electromagnetic lens thus can be provided when the electrostatic lens is considered with the magnetic lens generated by the objective lens 200.

Except the embodiment in FIG. 10A, some other embodiments are also provided, because electric optical devices can be configured with different portfolio, and some other electric optical devices can also be applied to the SEM to lower aberration. Please refer to FIG. 10B, BSE detector 442 locates below the retard electrode 452 to collect BSE as much as possible.

Figure 10C:
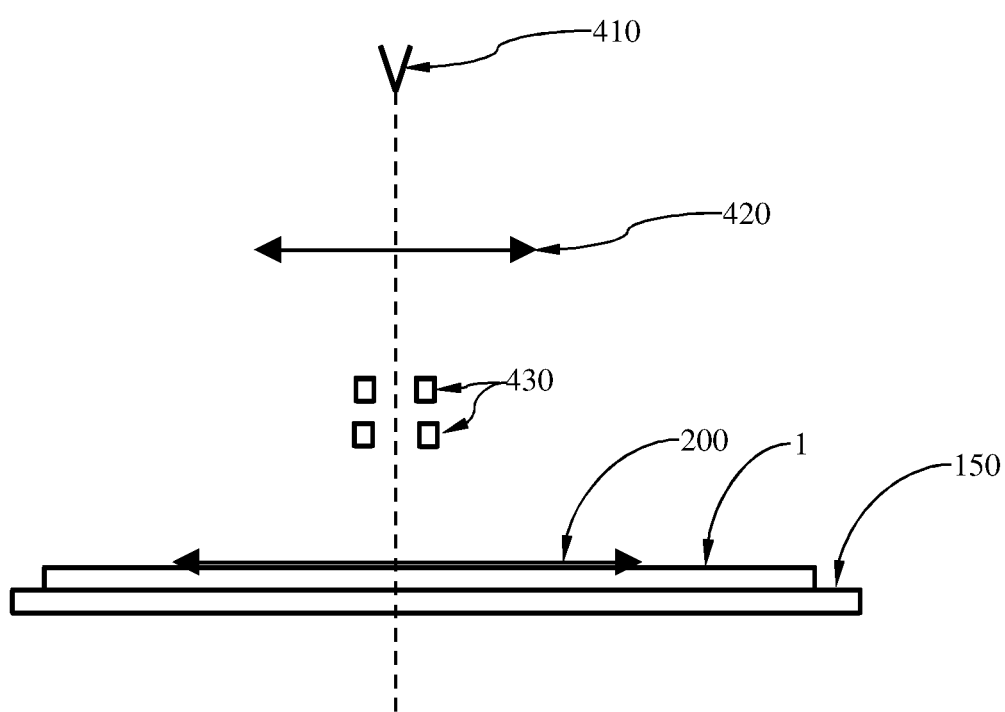

Please refer to FIG. 10C that an electron optical illustration of the present invention is shown, which is similar to conventional immersion SEM. The electron source 410 provide and electron beam condensed by the condenser lens 420. The scanning unit 430 scans the electron beam on the sample. The electron beam is focused by the objective lens 200.

Figure 11:
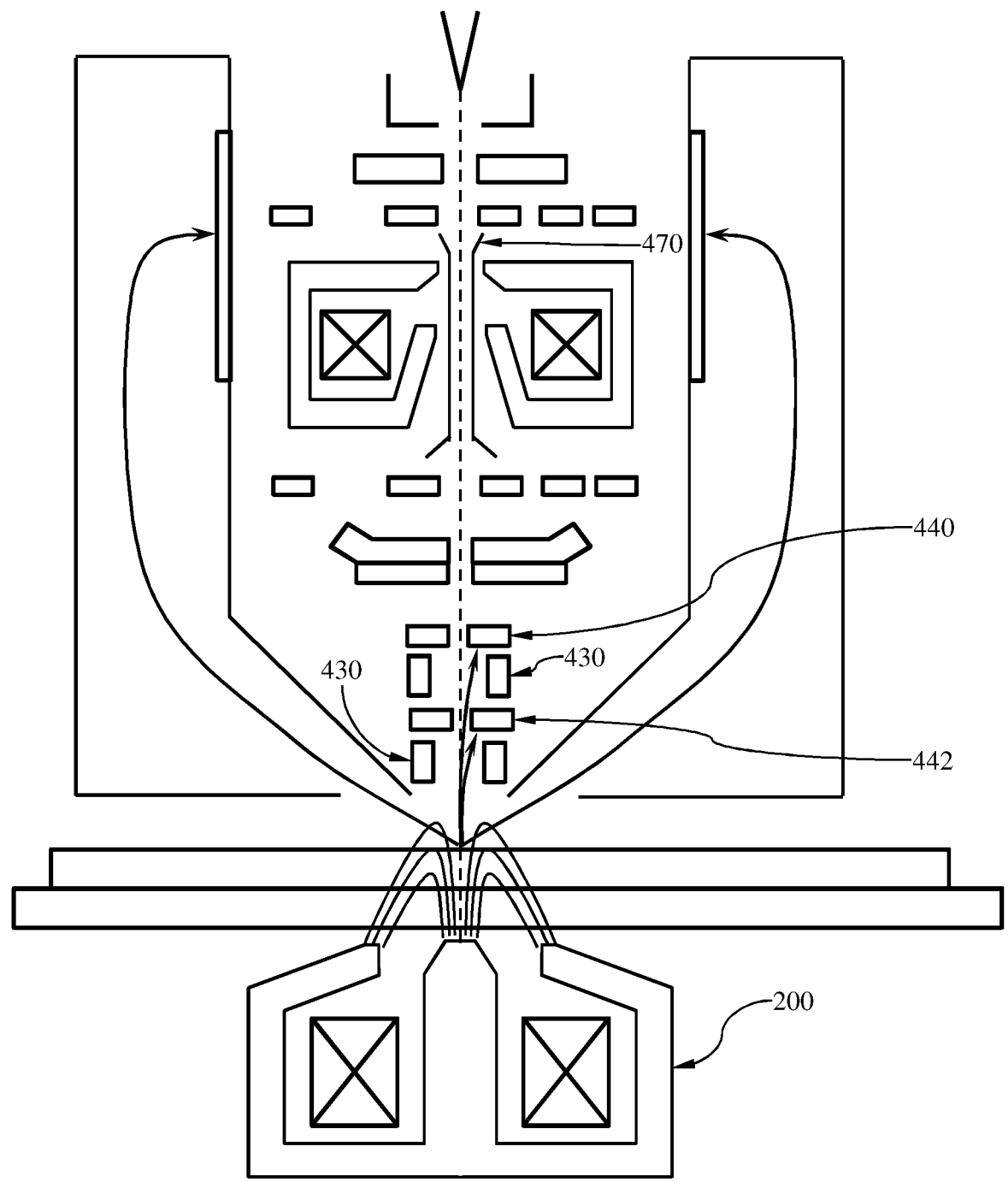
FIG. 11 illustrates a cross sectional view of SEM in accordance with another embodiment of the present invention.

Please refer to FIG. 11, a booster 470 is configured inside the condenser lens 420 to accelerate electron to lower aberration incurred from Coulomb compel force. The booster 470 is a conductive tube with different voltages applied to both ends of the tube. The electrons are thus accelerated inside the booster 470. With the assistance of booster 470, there is no necessary to apply very large potential to the electron emitter. SE detector 440 and BSE detector 442 both located below the retard electrode 452 in this embodiment. The BSE detector 442 locates between the scanning unit 430.

Figure 12:
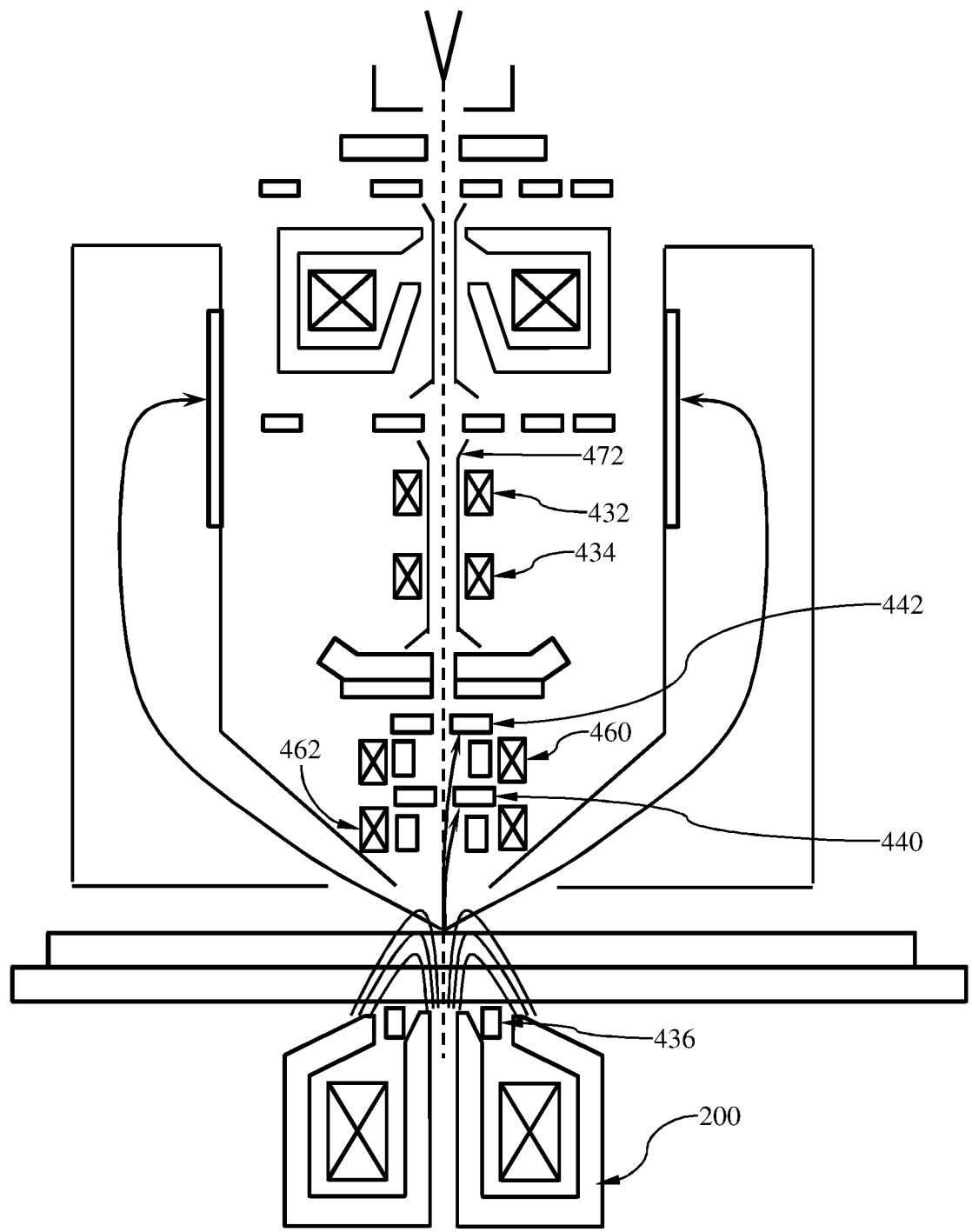
FIG. 12 illustrate a cross sectional view of SEM in accordance with another embodiment of the present invention.

Please refer to FIG. 12, another booster 472, between the beam current adjustable plate 422 and retard electrode 452, provides a second accelerating to the electron beam. A Wien filter 462 locates below the SE detector 440 and another Wien filter 462 locates below the BSE detector 442. Wien filters 460 and 462 provide energy filtering function to charged particles, such that most SE can be collected by SE detector 440 while most BSE can be collected by BSE detector 442. The Wien filter provides electric field and magnetic field simultaneously such that charged particle will not be affected when the charged along a first direction through the Wien filter, but will be deflected on the opposite direction. The deflecting direction and intensities are determined by the electric field and magnetic field of the Wien filter. Due the SE has lower energy, the Wien filter 462 thus provides lower energy to deflect the SE into the SE detector 440 while the BSE will not be deflected by the Wien filter 462. Then the Wien filter 460 will provide more powerful energy and the BSE will be deflected to the BSE detector 442. Furthermore, by using superposition principle, function of scanning unit can be combined to the Wien filters 460 and 462.

In this embodiment, a variable axial deflector 436 adjacent to the objective lens 200 to deflect optical axis of the objective lens 200. Possible variable axis lens (VAL) can be moving objective lens (MOL) and swing objective lens (SOL). Because the field of view (FOV) is too small for the SEM, and for the defect inspection, stage should be moving very frequently. However, the movement of stage is too time-consuming in the defect inspection. Thus, VAL can enlarge the FOV without moving the stage. Because the optical axis of the objective lens is deflected away, another deflector(s) will be necessary to deflect the electron beam to cooperate with the objective lens. In the FIG. 12, the VAL is MOL in this embodiment, and two deflectors 432 and 434 are necessary to deflect the electron beam to align with the optical axis of the objective lens 200. In this embodiment, because a second booster 472 is used, the two deflectors 432 and 434 have to be magnetic deflectors.

Figure 13:
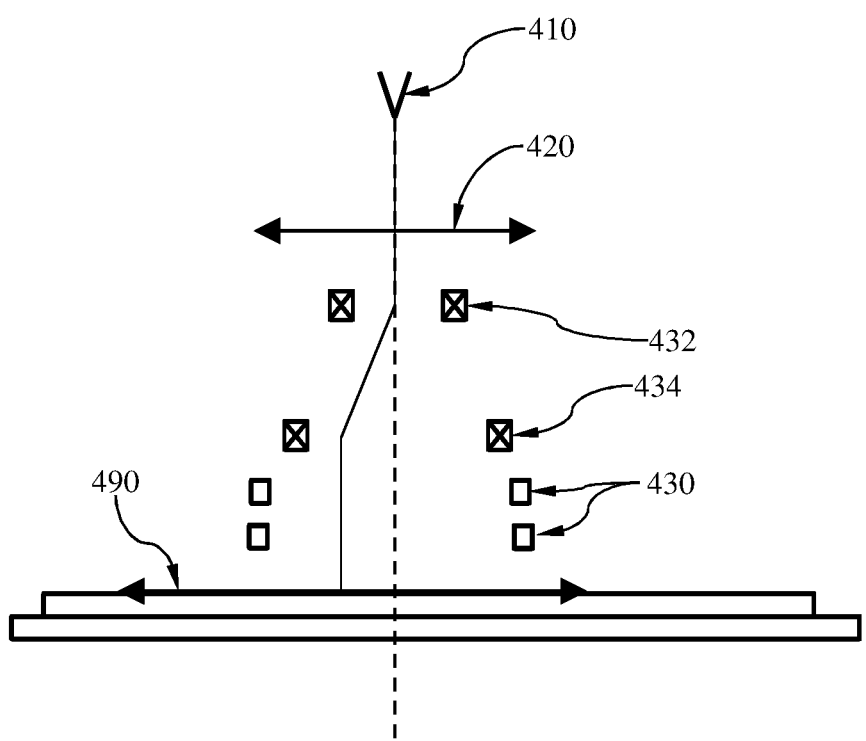
FIG. 13 illustrates an electro optical drawing of VAL in accordance with one embodiment of the present invention.

Please refer to FIG. 13 that electric optical illustration is shown. The VAL is MOL 490 and optical axis is deflected away from the original optical axis from the electron source 410. Two deflectors 432 and 434 to deflect the electron beam in advance to align with the optical axis of the MOL.

Figure 14A:
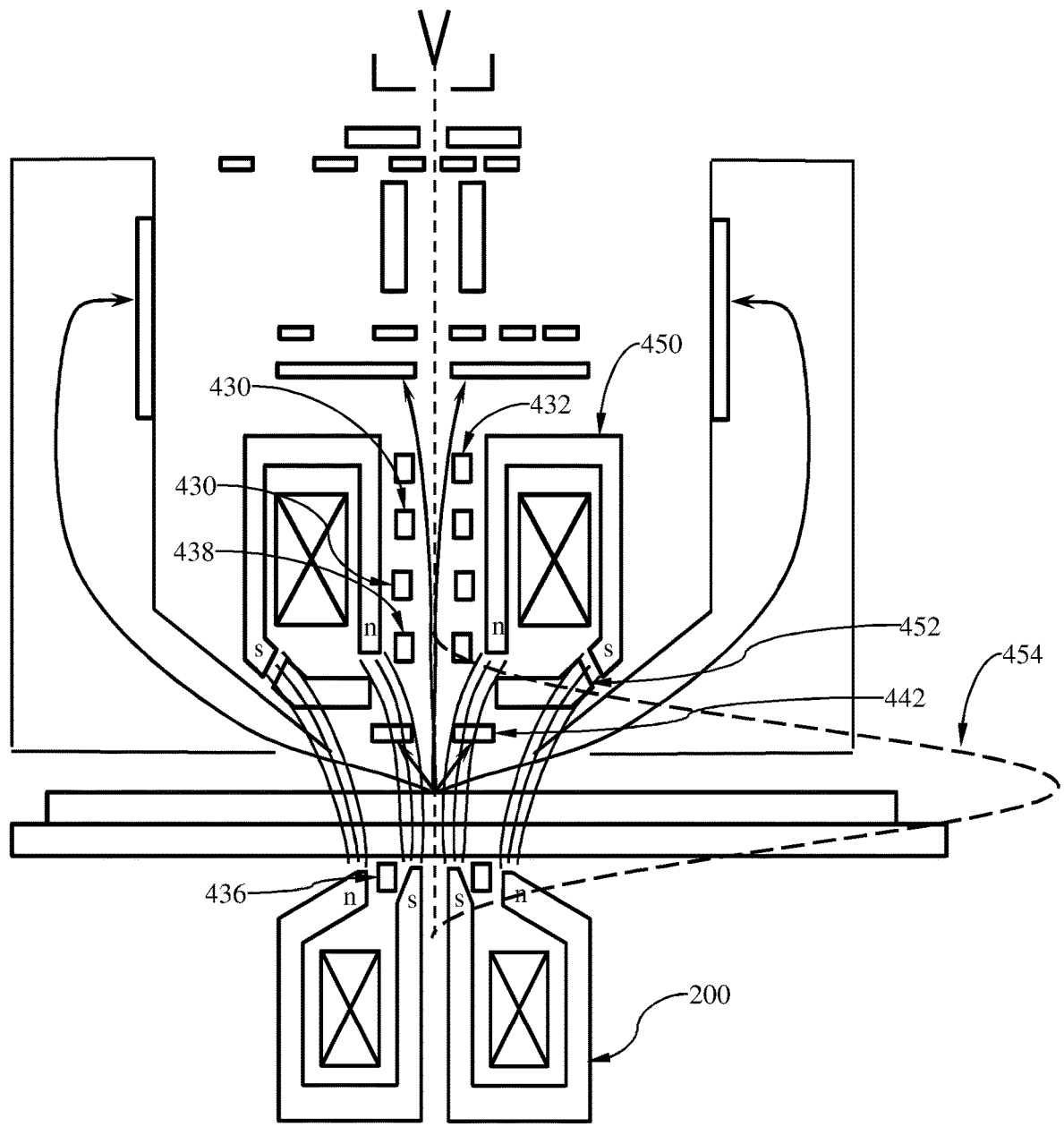
FIG. 14A to FIG. 14C illustrate cross sectional views of SEM in accordance with several embodiments of the present invention.

The present invention can be applied to conventional SEM. Please refer to FIG. 14A, a variable axis deflector 436 adjacent to the objective lens 200 will change the objective lens 200 to a SOL. Another conventional SOL 450 above the wafer 1 with a variable axis deflector 438 is provided. A deflector 432 is used to cooperate electron beam with the optical axis of both objective lens 450 and 200. The magnetic pole provided by outer polepiece of the objective lens 450 is the same to the outer polepiece of the objective lens 200, while the magnetic pole provided by the inner polepiece of the objective lens 450 is the same to the inner polepiece of the objective lens 200. The superposed magnetic fields will be increased much more, hence position of the objective lens 450 can be raised higher to fit a BSE detector 442 near surface of the wafer 1. Furthermore, the condenser lens 420 in this embodiment is electrostatic lens.

Figure 14B:
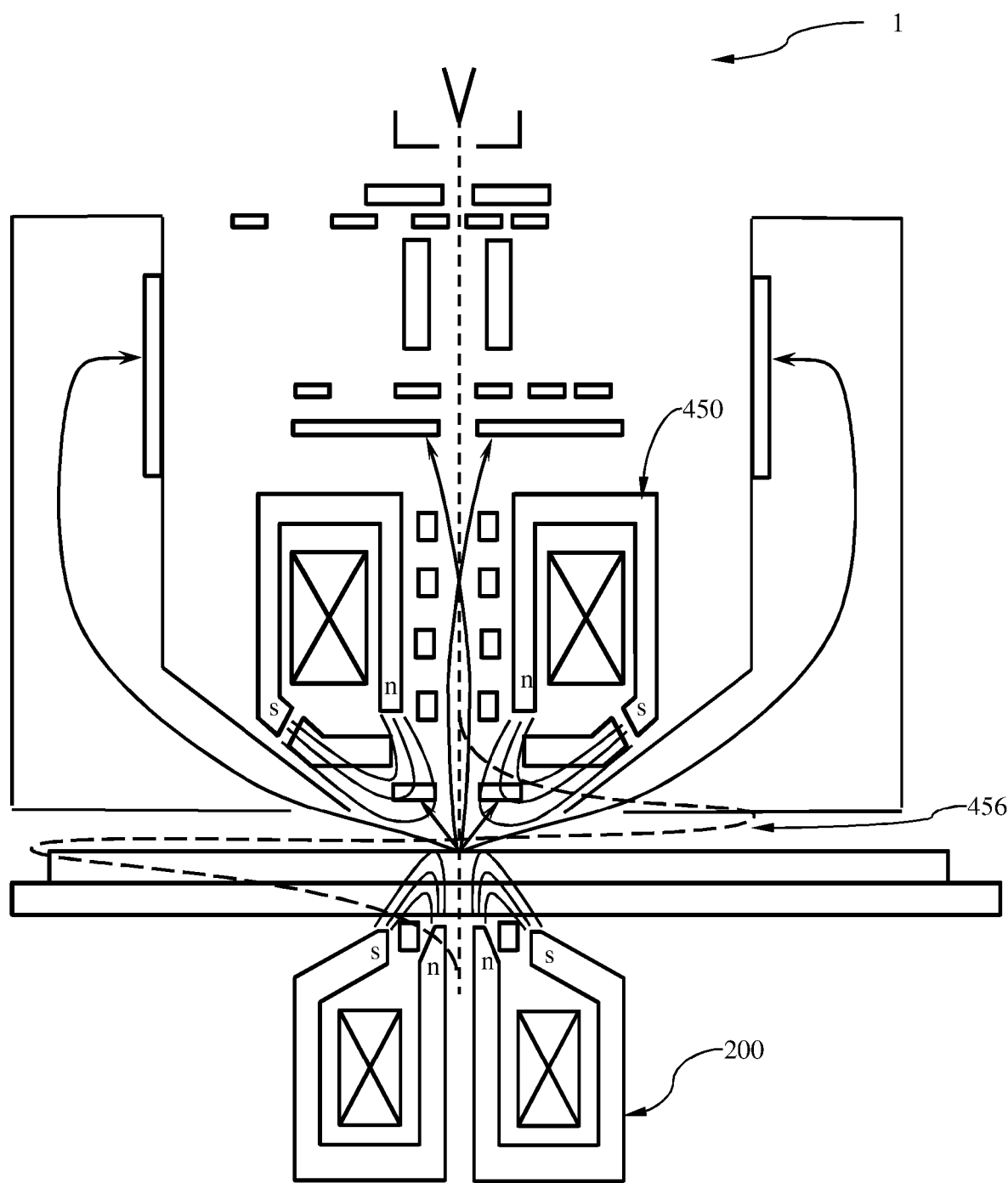
Figure 14C:
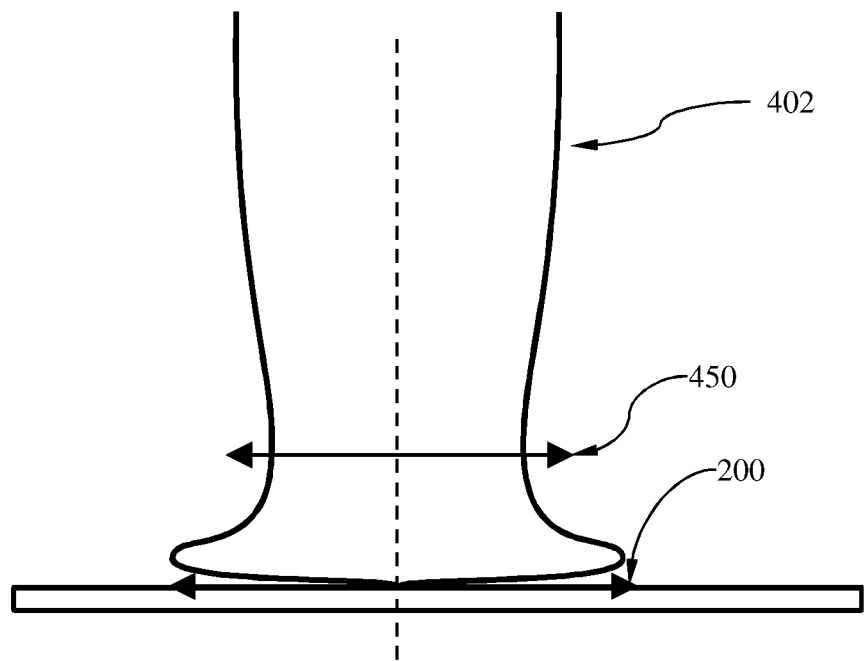

Please refer to FIG. 14B that magnetic fields of the objective lens 200 and objective lens 450 can be antisymmetric, such that magnetic field at the optical axis above the wafer will be zero; that means no focusing power. This magnetic field can be used to lower aberration. The electron optical illustration can be referred to FIG. 14C, in which the electron beam will be condensed by the objective lens 450 but later expanded at the position of zero magnetic field. The electron beam will be focused by the objective lens 200 very close to the sample surface. The antisymmetric magnetic field will not change behavior of focusing electron beam but change the rotation direction.

Figure 15:
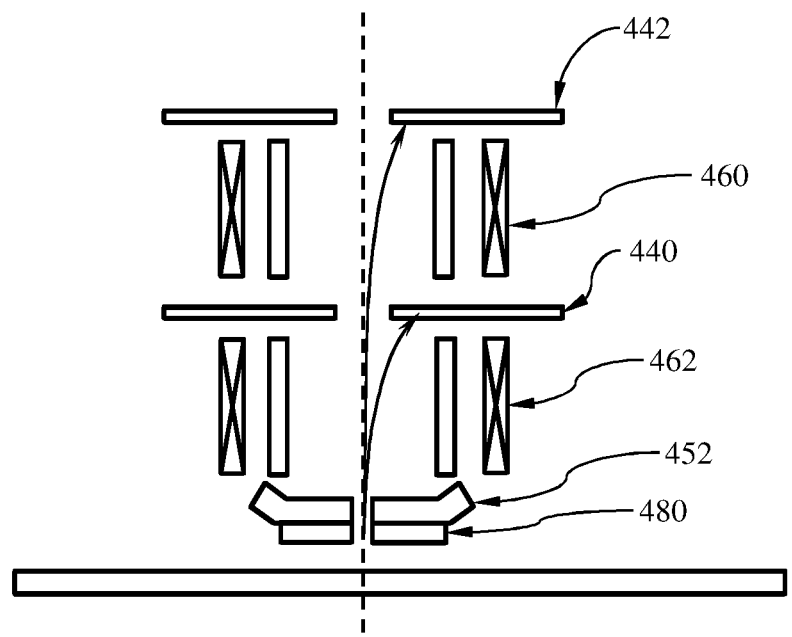
FIG. 15 illustrates a cross sectional view of detector system in accordance with one embodiment of the present invention.

Please refer to FIG. 15 that SE detector 440 and BSE detector 442 cooperate with the Wien filters 460 and 462. In this embodiment, both SE detector 440 and BSE detector 442 are above the retard electrode 452. In some SEM, energy filter is used to select SE or BSE. However, most energy filter occupies large space and may incur some other issue. Wien filter is also an energy function to deflect charged particles with different energies into variant direction. That would be better for the present invention.

Figure 16A:
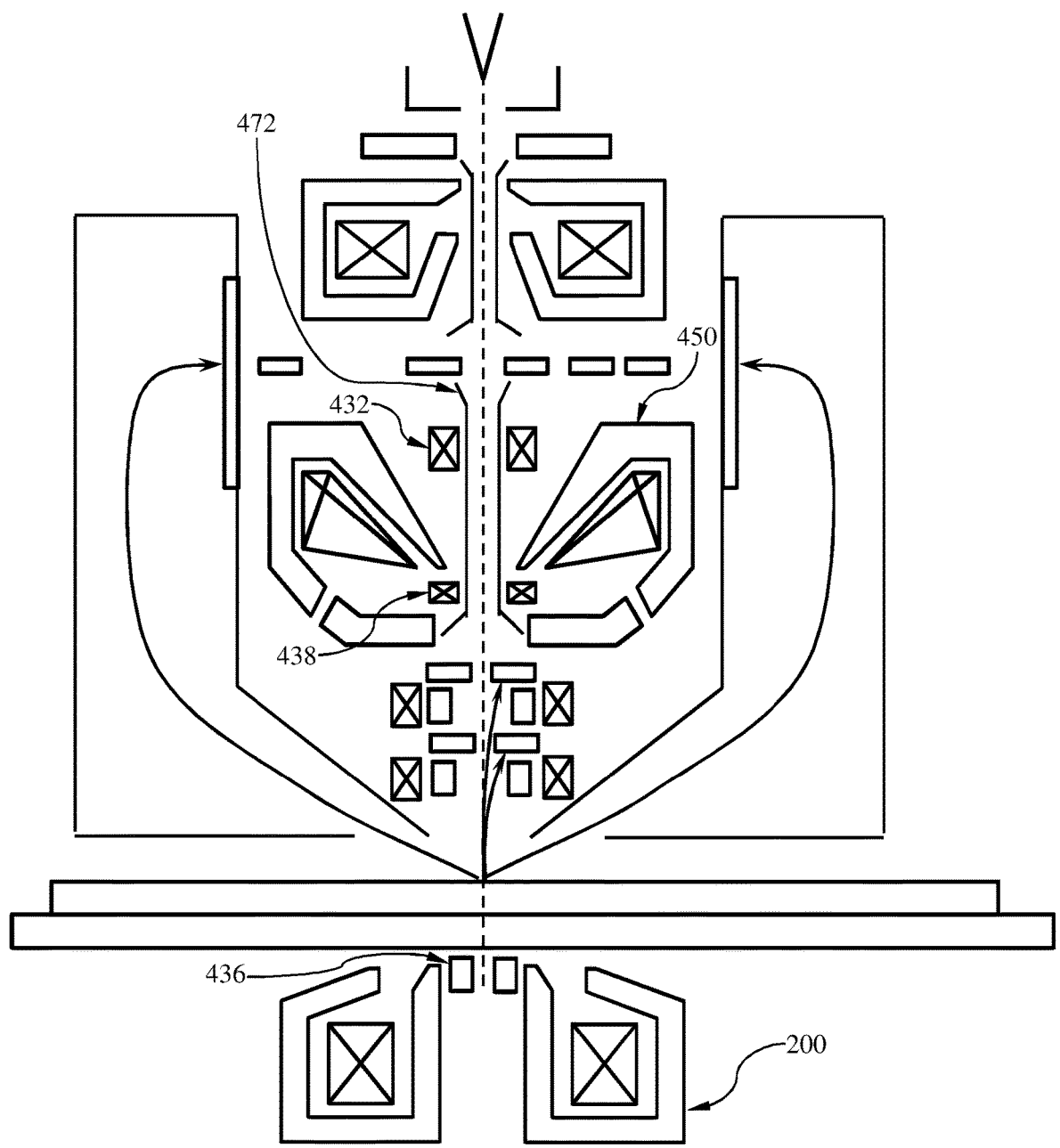
FIG. 16A and FIG. 16B illustrate cross sectional views of SEM in accordance with different embodiments of the present invention.

Please refer to FIG. 16A, a booster 472 can be applied inside the objective lens 450, and another variable axis deflector 438 can be provided at gap of the yoke. Another variable axis deflector 436 is applied to the objective lens 200. A deflector is necessary to change the electron beam to fit the varied optical axis of both objective lenses 200 and 450. The variable deflector 438 and the deflector 432 must be magnetic deflector due to the booster 472.

Figure 16B:
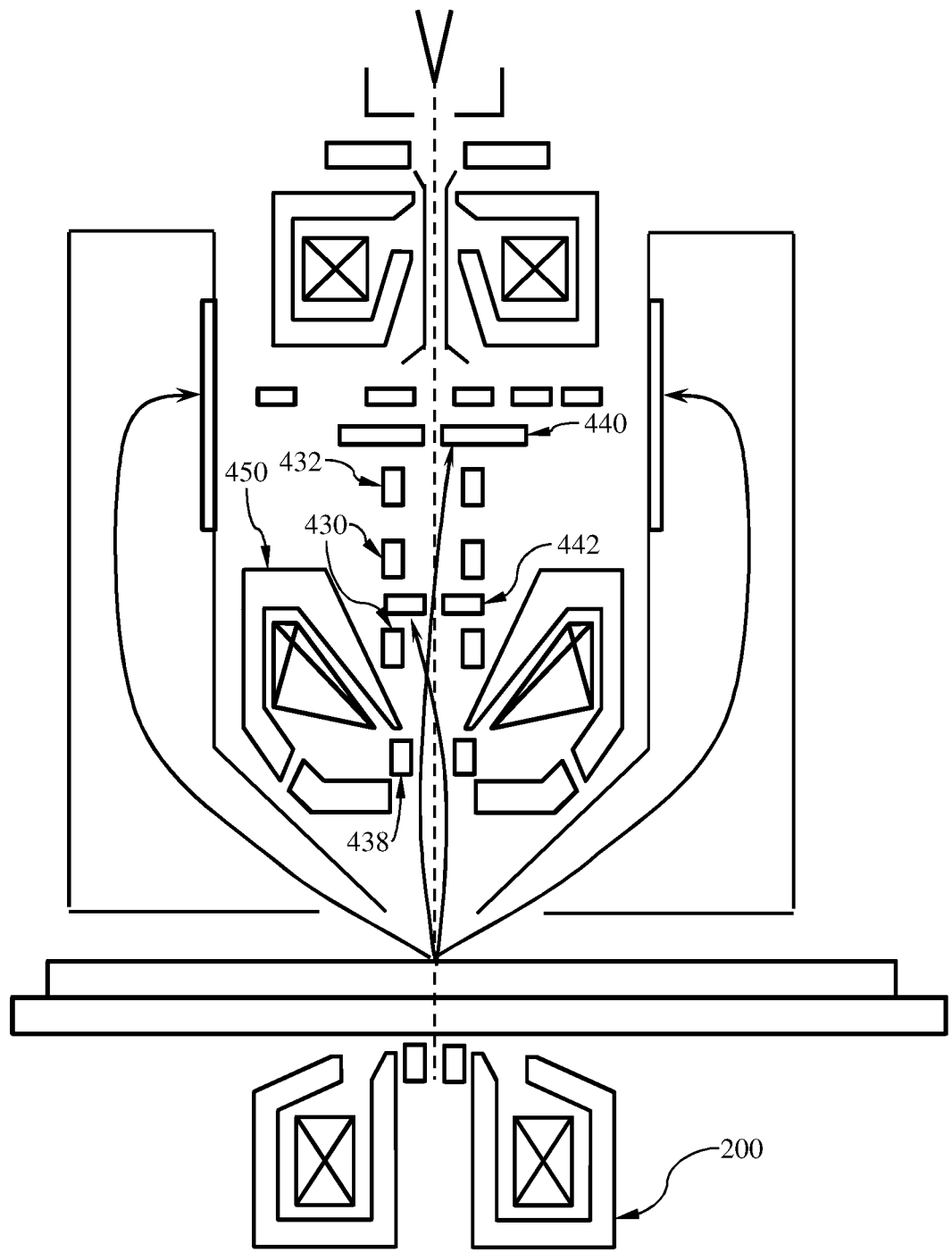

Please refer to FIG. 16B that all detectors are above the objective lens 450, and deflector 430 as well as variable axis deflector 438 can be electric deflector. The signal electrons before entering both detectors will be changed by the objective lens 450.

Figure 17A:
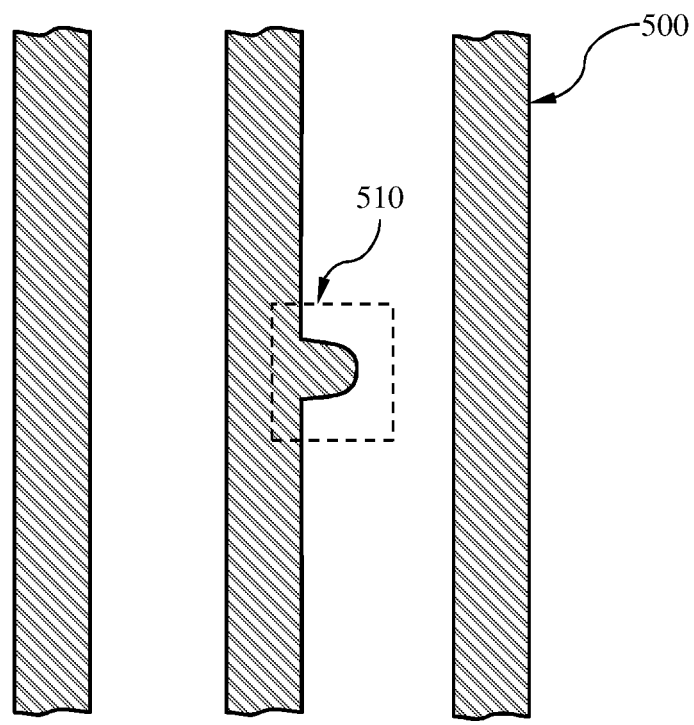
FIG. 17A to FIG. 17C illustrate applications of in the defect inspection and defect review by using SEM of the present invention.
Figure 17B:
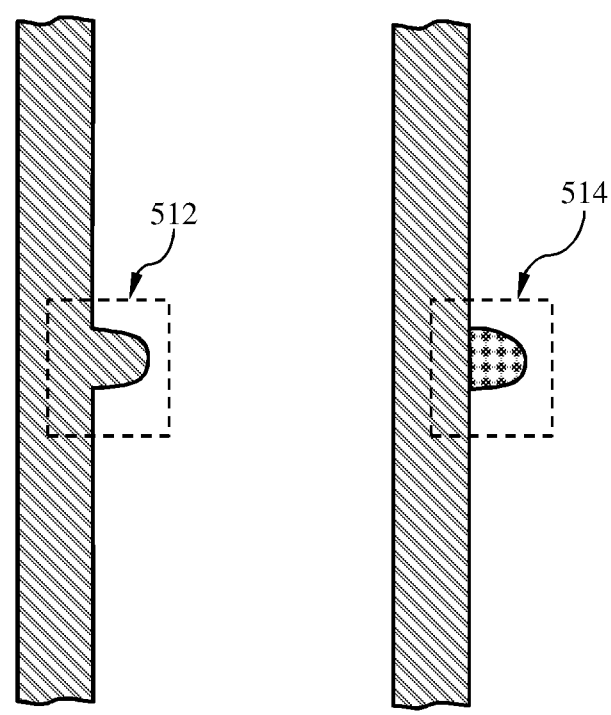

For the application of SEM of the present invention, one advantage in the defect inspection is provided. Please refer to FIG. 17A that a general SE image is provided. There are three line patterns 500, and one defect 510 in the middle line pattern. Such a line pattern in the semiconductor device may be gate line, fin, or interconnection. This defect 510 is detected or identified by comparing to some other the same pattern in different die or different region in the same die, because the defect 510 does not appear in any other corresponded regions. However, only pattern of the defect is identified but no further information is obtained. Root cause can't be analyzed. However, if the defect 512 has the same material to the line pattern 500, as shown in FIG. 17B, the defect 512 may be systematic defect and may be happened at the lithography process. If the defect 514 has different material to the line pattern 500, it may be random defect and can be some particle dropped over there. If only SE image is provided, the wafer has to be sent to review SEM to be analyzed. However, the wafer transfer from the ebeam inspection tool to the review SEM will experience the environments among atmosphere, vacuum, atmosphere, vacuum, and atmosphere. And the wafer needs to experiences at least double times evacuating and venting. Thus, a one-time inspection to analyze root cause of defect can save more time both in research and development stage or manufacturing stage.

Figure 17C:
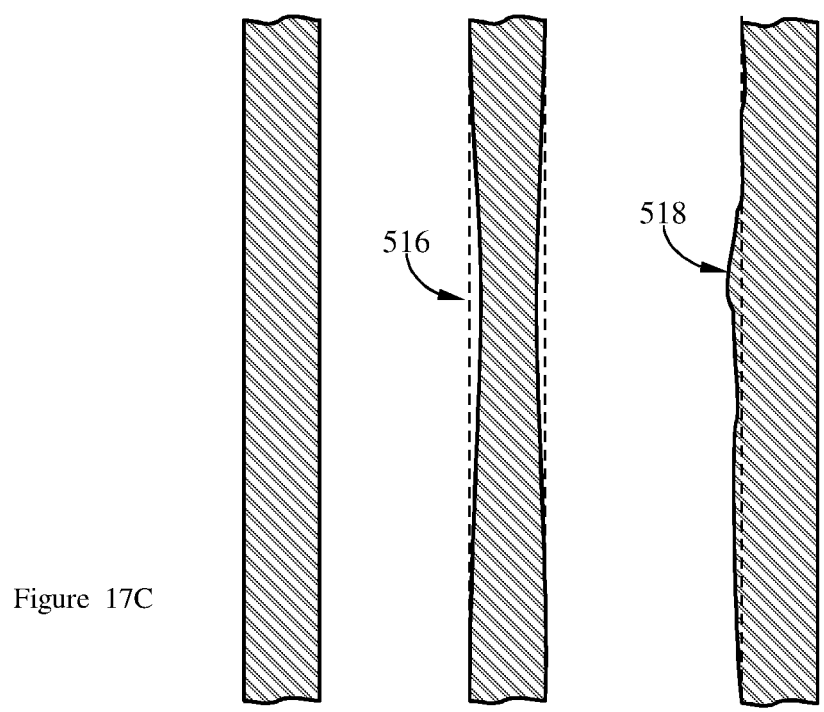

Please refer to FIG. 17C that another kinds of defects are shown. Patterns 516 is thinner than normal line pattern 500 and this kind of defect is no easy to be identified if only SE image is provided. For most situations, width of a line pattern can't be identified by using ebeam inspection tool, while review SEM has no throughput to inspect this kind of defect. Another defect is the roughness 518 of a line pattern. In the EUV lithography, most line patterns are not straight as before, and roughness of a line is critical such as critical dimension is critical in 1990. If the material information can be obtained in the defect inspection, such a defect can be detected much more easily.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A charged particle beam apparatus, comprising:
   a charged particle source for providing a charged particle beam;
   a condenser lens for condensing the charged particle beam;
   a scanning unit for scanning the charged particle beam on a sample;
   a stage including an electrostatic chuck for supporting the sample, a first mesa movable in a first direction, and a second mesa movable in a second direction, wherein the first direction is different from the second direction;
   a detector system for receiving signal particles from the sample after the charged particle beam impinges on the sample; and
   an objective lens, below said electrostatic chuck stage, including a central polepiece aligned to the charged particle beam for focusing the charged particle beam on the sample, wherein the central polepiece protrudes through the first mesa and the second mesa and is located below and adjacent to the electrostatic chuck.

2. The charged particle beam apparatus according to claim 1, wherein the charged particle source provides an electron beam.

3. The charged particle beam apparatus according to claim 2, wherein said stage is a maglev stage.

4. The charged particle beam apparatus according to claim 3, wherein said maglev stage includes a first mesa movable along a first direction horizontally, a second mesa movable along a second direction horizontally perpendicular to the first direction, and an electrostatic chuck on the second mesa.

5. The charged particle beam apparatus according to claim 4, wherein said first mesa and second mesa are vertically movable.

6. The charged particle beam apparatus according to claim 5, wherein the central polepiece protrudes to the sample.

7. The charged particle beam apparatus according to claim 6, wherein the signal particles includes secondary electrons (SE), backscattered electrons (BSE), and Auger electrons (AE).

8. The charged particle beam apparatus according to claim 7, wherein said detector system includes a SE detector, a BSE detector, and an AE detector for receiving secondary electrons, backscattered electrons, and Auger electrons respectively.

9. The charged particle beam apparatus according to claim 8, further comprising a booster inside the condenser lens to accelerate the electron beam.

10. The charged particle beam apparatus according to claim 9, further comprising a retard electrode above the sample to retard the electron beam.

11. The charged particle beam apparatus according to claim 10, further comprising a ferrite layer below said retard electrode to couple with a magnetic field generated by the objective lens.

12. The charged particle beam apparatus according to claim 11, further comprising a first Wien filter for filtering the secondary electrons into said SE detector, and a second Wien filter for filtering the backscattered electrons into said BSE detector.

13. The charged particle beam apparatus according to claim 12, further comprising a variable deflector around the central pole piece of the objective such that said objective lens is a variable axis lens.

14. The charged particle beam apparatus according to claim 13, wherein the variable axis lens is a moving objective lens.

15. The charged particle beam apparatus according to claim 14, further comprising a first deflector and a second deflector to move the electron beam along an axis of the moving objective lens.

16. The charged particle beam apparatus according to claim 13, wherein the variable axis lens is a swing objective lens.

17. The charged particle beam apparatus according to claim 16, further comprising a deflector to moving the electron beam along an axis of the swing objective lens.

18. An electron beam apparatus, comprising:
an electron source for providing an electron beam;
a condenser lens for condensing the electron beam;
a scanning unit for scanning the charged particle beam on a sample;
a first objective lens below said condenser lens for focusing the electron beam;
a maglev stage, below said first objective lens, including an electrostatic chuck for supporting the sample, a first mesa movable in a first direction, and a second mesa movable in a second direction, wherein the first direction is orthogonal to the second direction;
a detector system for receiving signal electrons from the sample after the electron beam impinges on the sample; and
a second objective lens, below said electrostatic chuck, including a central polepiece, aligned to the charged particle beam and protruding towards the sample, for focusing the electron beam on the sample, wherein the central polepiece protrudes through the first mesa and the second mesa and is located below and adjacent to the electrostatic chuck.

19. The electron beam apparatus according to claim 18, further comprising a retard electrode above the sample to retard the electron beam.

20. The electron beam apparatus according to claim 19, further comprising a ferrite layer below said retard electrode to couple with a magnetic field generated by the second objective lens.

* * * * *